United States Patent
Chung

(10) Patent No.: US 8,130,483 B2
(45) Date of Patent: Mar. 6, 2012

(54) CAPACITOR STRUCTURE

(75) Inventor: Chul-Ho Chung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 12/659,687

(22) Filed: Mar. 17, 2010

(65) Prior Publication Data
US 2010/0238603 A1    Sep. 23, 2010

(30) Foreign Application Priority Data
Mar. 18, 2009    (KR) .................. 10-2009-0022867

(51) Int. Cl.
  *H01G 4/30*    (2006.01)
(52) U.S. Cl. .................. 361/301.4; 361/303; 361/305; 361/311; 361/321.2; 361/306.3
(58) Field of Classification Search ............... 361/301.4, 361/308.1, 309, 311–313, 303–305, 321.1–321.5, 361/306.1–306.3
See application file for complete search history.

(56) References Cited

U.S. PATENT DOCUMENTS

| | | | |
|---|---|---|---|
| 6,266,226 B1 * | 7/2001 | Hayashi .................. 361/303 |
| 6,445,565 B1 * | 9/2002 | Toyoda et al. .................. 361/303 |
| 6,690,570 B2 * | 2/2004 | Hajimiri et al. ............. 361/306.1 |
| 6,864,526 B2 * | 3/2005 | Inbe ............................. 257/300 |
| 6,903,402 B2 * | 6/2005 | Miyazawa .................... 257/296 |
| 7,009,832 B1 * | 3/2006 | Chen et al. ................. 361/306.1 |
| 7,209,340 B2 * | 4/2007 | Iioka et al. ................. 361/306.3 |
| 7,335,956 B2 | 2/2008 | Chen et al. |
| 2007/0155112 A1 | 7/2007 | Park |

FOREIGN PATENT DOCUMENTS
JP    2008-004734 A    1/2008
KR    10-0731078 B1    6/2007

\* cited by examiner

*Primary Examiner* — Nguyen T Ha
(74) *Attorney, Agent, or Firm* — Lee & Morse, P.C.

(57) ABSTRACT

In a capacitor structure and method of forming the same, a first electrode, a second electrode, and a first insulation layer are sequentially formed on a substrate. The first and second electrodes and the first insulation layer are covered with a second insulation layer on the substrate. A first plug is in contact with the second electrode through the second insulation layer. A second plug is in contact with the first electrode through the first and second insulation layer. A third insulation layer is formed on the second insulation layer. Third and fourth comb-shaped electrodes are formed in the third insulation layer. The third electrode is contact with the first plug and the fourth electrode is contact with the second plug while facing the third electrode. Thus, the teeth of the comb-shaped electrodes are alternately arranged and spaced apart in the third insulation layer.

12 Claims, 10 Drawing Sheets

CAPACITOR STRUCTURE

BACKGROUND

1. Field

Example embodiments relate to a capacitor structure and a method of forming the same, and more particularly, to a capacitor structure for a semiconductor device and a method of forming the same.

2. Description of the Related Art

In general, a capacitor structure holds electrons therein and emits the electrons for operating an electronic circuit such as an integrated circuit in a semiconductor device. As the integration degree of the integrated circuit is increased, the size of unit cells are reduced in a semiconductor device and capacitance for operating the integrated circuit is increased.

A metal-insulator-metal (MIM) capacitor or a metal-oxide-metal (MOM) capacitor is usually used as the capacitor for the semiconductor device. In the conventional MIM capacitor including a dielectric layer or an insulating layer between lower and upper electrodes, the capacitance per unit area of the capacitor is improved by a) increasing the dielectric constant of the dielectric layer, b) by reducing the thickness of the dielectric layer or c) by increasing the contact area between the lower electrode and the dielectric layer and between the upper electrode and the dielectric layer. In the conventional MOM capacitor including a pair of parallel electrode structures facing each other, the parallel electrode structures extend in a vertical direction, to thereby improve the capacitance per unit area of the capacitor.

However, the cell size of the semiconductor device has been significantly reduced and the dielectric materials having large dielectric constant sufficiently compensating for the cell size reduction become difficult to obtain, and thus there has been in much difficulties for increasing the capacitance per unit area in a semiconductor device.

SUMMARY

Embodiments are therefore directed to a capacitor structure and method of forming the same, which substantially overcome one or more of the problems due to the limitations and disadvantages of the related art.

It is therefore a feature of an embodiment to provide a capacitor structure having an improved capacitance per unit area in an electronic device.

It is therefore another feature of an embodiment to provide a method of forming the above capacitor structure.

At least one of the above and other features and advantages may be realized by providing a capacitor structure including a pair of first and second plate electrodes vertically stacked on a substrate, a first insulation layer for electrically insulating the first and second plate electrodes, a second insulation layer for covering the first and second electrodes and the first insulation layer, at least a first plug making electrical contact with the second electrode penetrating through the second insulation layer, at least a second plug making electrical contact with the first electrode penetrating through the first and the second insulation layers, a third insulation layer on the second insulation layer, a comb-shaped third electrode making contact with the first plug in the third insulation layer and a comb-shaped fourth electrode making contact with the second plug in the third insulation layer and facing the third comb-shaped electrode. The substrate may include at least an inner wiring therein. The first insulation layer may be at least partially interposed between the first and the second electrodes, and thus the first and second plate electrodes are electrically insulated from each other. The third electrode may include a first common wiring extending in a first direction and a plurality of first branch wirings that is commonly connected to the first common wiring and extends in a second direction perpendicular to the first direction. The fourth electrode may include a second common wiring extending in the first direction and a plurality of second branch wirings that is commonly connected to the second common wiring and extends in the second direction in such a configuration that the first and the second branch wirings are alternately arranged and spaced apart.

In some example embodiments, the second electrode may overlap the first electrode in such a configuration that the second electrode may not be positioned on a side portion of the first electrode, so that the fourth electrode may be positioned over the side portion of the first electrode with the first and the second insulation layers in between.

In some example embodiments, the third and the fourth electrodes may include a multi-layered structure having a plurality of metal wirings vertically stacked and a plurality of via plugs for electrically connecting the metal wirings.

In some example embodiments, the capacitor structure may further include a fourth insulation layer below the first electrode on the substrate, a comb-shaped fifth electrode arranged in the fourth insulation layer, a comb-shaped sixth electrode arranged in the fourth insulation layer and facing the fifth comb-shaped electrode, a fifth insulation layer interposed between the fourth insulation layer and the first electrode such that the first and second electrodes are electrically insulated from the fifth and the sixth comb-shaped electrodes, at least a third plug making electrical contact with the first and the fifth electrodes penetrating through the fifth insulation layer and at least a fourth plug making contact with the second electrode penetrating through the second insulation layer. The fifth electrode may include a third common wiring extending in the first direction and a plurality of third branch wirings that is commonly connected to the third common wiring and extends in the second direction. The sixth electrode may include a fourth common wiring extending in the first direction and a plurality of fourth branch wirings that is commonly connected to the fourth common wiring and extends in the second direction in such a configuration that the third and the fourth branch wirings are alternately arranged and spaced apart in the second direction.

In some example embodiments, the first and the second electrodes may partially overlap in such a configuration that the second electrode may cross the first electrode in the second direction, so that the fourth electrode may be positioned over a side portion of the first electrode with the first and the second insulation layers in between, and the sixth electrode may be positioned below a side portion of the second electrode with the first and the fifth insulation layers in between.

In some example embodiments, the capacitor structure may further include a fifth plate electrode positioned below the first electrode and on the substrate, a fourth insulation layer interposed between the first electrode and the fifth electrode, a comb-shaped sixth electrode arranged in the second insulation layer and facing the fourth comb-shaped electrode and at least a third plug making electrical contact with the fifth and the sixth electrodes penetrating through the second and the fourth insulation layers. The fifth electrode may be electrically insulated from first electrode by the fourth insulation layer. The sixth electrode may include a third common wiring extending in the first direction and a plurality of third branch wirings that may be commonly connected to the third common wiring and may extend in the second direction in such a configuration that the second and the third branch wirings may be alternately arranged and be spaced apart in the second direction at a central portion of the second insulation layer, and the first and the third branch wirings may be alternately arranged and spaced apart in the second direction at a peripheral portion of the second insulation layer.

In some example embodiments, the first electrode may overlap the fifth electrode in such a configuration that the first electrode may not be positioned on a side portion of the fifth electrode and the second electrode may overlap the first electrode in such a configuration that the second electrode may not be positioned on a side portion of the first electrode, so that the sixth electrode may be positioned over the fifth electrode with the fourth and the second insulation layers in between.

In some example embodiments, the capacitor structure may include at least a fourth plug making contact with the sixth electrode and the inner wiring in the substrate through the second insulation layer.

According to other example embodiments, there is provided a method of forming the capacitor structure. A pair of first and second plate electrodes and a first insulation layer between the first and the second electrodes may be vertically formed on a substrate, and thus the first and the second electrodes may be electrically insulated from each other by the first insulation layer. A second insulation layer may be formed on the substrate such that the first and the second electrodes and the first insulation layer may be covered with the second insulation layer. At least a first plug making electrical contact with the second electrode and at least a second plug making electrical contact with the first electrode may be formed in the first and second insulation layers, respectively. The first plug may penetrate through the second insulation layer and the second plug may penetrate through the second and the first insulation layers. A third insulation layer may be formed on the second insulation layer having a first trench through which the first plug is exposed and a second trench through which the second plug is exposed. A third comb-shaped electrode may be formed in the first trench and a fourth comb-shaped electrode may be formed in the second trench. Accordingly, the third electrode may include a first common wiring extending in a first direction and a plurality of first branch wirings that may be commonly connected to the first common wiring and extends in a second direction perpendicular to the first direction, and the fourth electrode may include a second common wiring extending in the first direction and a plurality of second branch wirings that may be commonly connected to the second common wiring and may extend in the second direction in such a configuration that the third and the fourth electrodes may face each other and the first and the second branch wirings may be alternately arranged and spaced apart in the second direction.

In some example embodiments, the second electrode may overlap the first electrode in such a configuration that the second electrode may not be positioned on a side portion of the first electrode, so that the fourth electrode may be positioned over the side portion of the first electrode with the first and the second insulation layers in between.

According to some example embodiments of the present inventive step, a plurality of the capacitors may be formed along vertical and horizontal directions in the capacitor structure, to thereby improve an overall capacitance per unit area of the capacitor structure.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
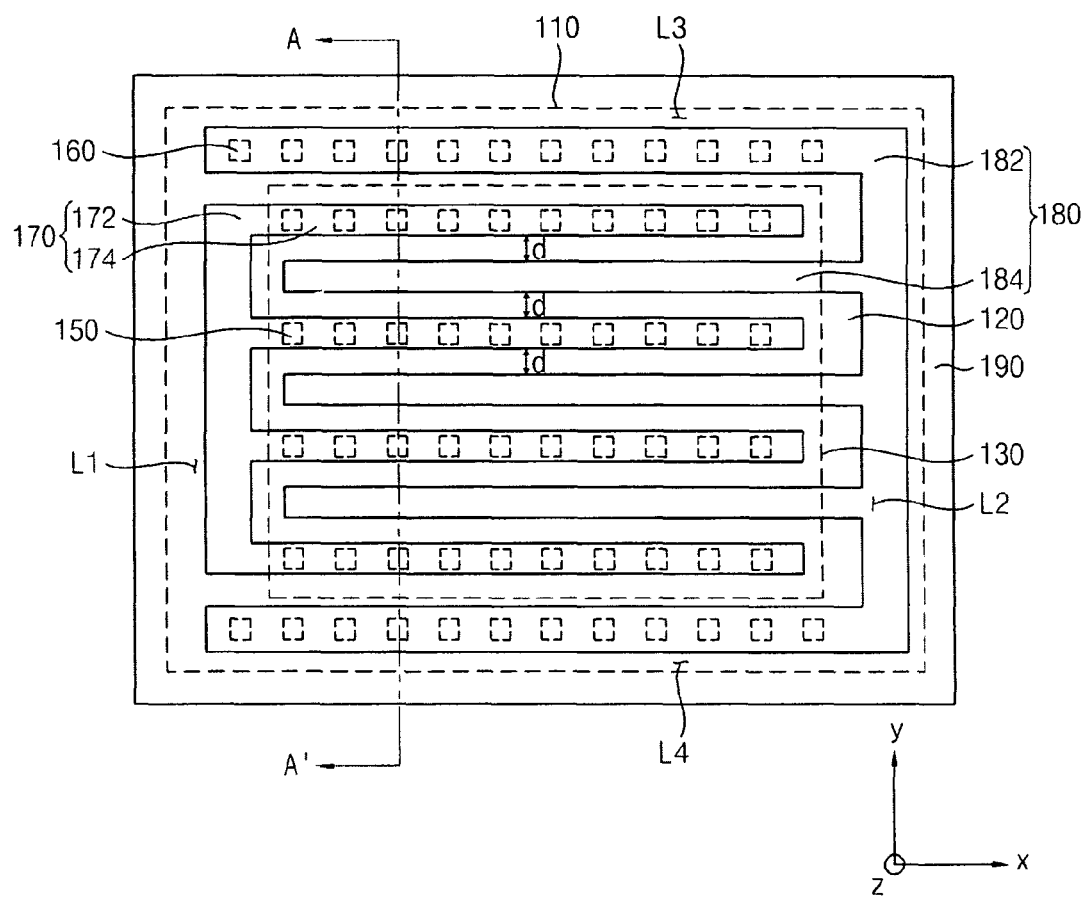
FIG. 1 illustrates a plan view of a capacitor structure in accordance with a first example embodiment of the present inventive concept.

This application claims priority under 35 U.S.C. §119 to Korean Patent Application No. 2009-22867, filed on Mar. 18, 2009 in the Korean Intellectual Property Office (KIPO), the contents of which are herein incorporated by reference in their entirety.

Various example embodiments will be described more fully hereinafter with reference to the accompanying drawings, in which some example embodiments are shown; which may be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Embodiment I

Figure 2:
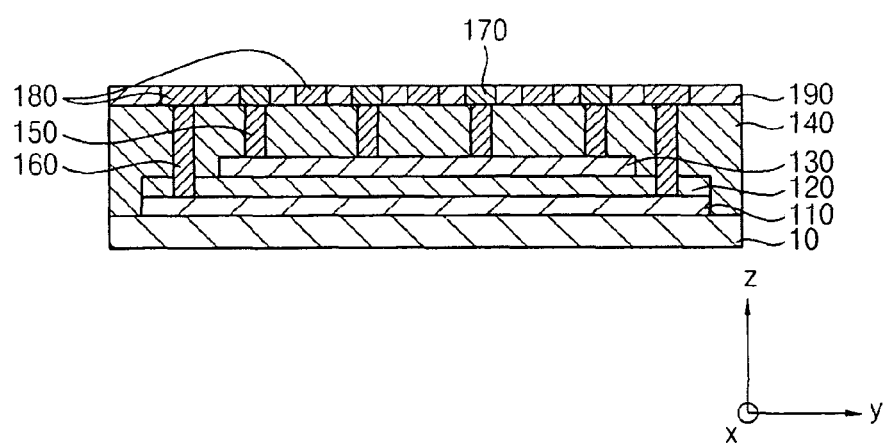
FIG. 2 illustrates a cross-sectional view taken along a line A-A' of FIG. 1.

FIG. 1 illustrates a plan view of a capacitor structure in accordance with a first example embodiment of the present inventive concept. FIG. 2 illustrates a cross-sectional view taken along a line A-A' of FIG. 1. In FIGS. 1 and 2, a direction parallel with the line A-A' is referred to as a first direction, i.e., along a y-axis, a direction vertical to the line A-A' is referred to as a second direction, i.e., along an x-axis, and a direction orthogonal to both the first and second directions, i.e., along a z-axis, is referred to as a third direction, i.e., a direction vertical relative to the plan view. These directions are all defined with respect to one another, so the ordinal adjectives describing these directions, i.e., terms "first", "second", and "third", are not of particular importance. For example, in the claims and the detailed description, the term "first" may be used to designate a direction initially referred to, and so forth, and will be used consistently throughout the respective sections of the specification, although the respective sections may differ in their usage for internal consistency.

Referring to FIGS. 1 and 2, a capacitor structure 100 in accordance with a first example embodiment of the inventive concept (referred to as a first capacitor structure) may include a first electrode 110, a first insulation layer 120, a second electrode 130, a second insulation layer 140, a first plug 150, a second plug 160, a third electrode 170, a fourth electrode 180, and a third insulation layer 190.

In an example embodiment, the first capacitor structure 100 may be formed on a semiconductor substrate 10 having various unit conductive structures of a semiconductor device. For example, the unit conductive structure may include a transistor, a resistor, a capacitor, and various wiring structures. In the present example embodiment, the substrate 10 may include an active region and a lower insulation layer (not shown) may be formed on the substrate 10. The lower insulation layer may include one of silicon oxide, silicon nitride, and combinations thereof. The lower insulation layer may include a multilayer in which a number of layers may be sequentially stacked on the substrate 10. An additional layer may be interposed between the substrate 10 and the lower insulation layer, as would be known to one of the ordinary skill in the art. A plug (not shown) may penetrate through the lower insulation layer to make contact with a portion of the substrate 10.

The first electrode 110 may be positioned on the substrate 10 and be shaped into a plate on the substrate 10. The first insulation layer 120 may be positioned on the first electrode 110 and may include silicon nitride or a high-k material, i.e., a material having an electrical resistance higher than that of silicon nitride. Examples of the high-k material may include tantalum oxide, hafnium oxide, etc. These may be used alone or in combinations thereof. The second electrode 130 may be arranged on the first insulation layer 120 and may be shaped into a plate on the first insulation layer 120.

In an example embodiment, the second plate electrode 130 may be positioned on the first insulation layer 120 in such a configuration that the second electrode 130 may be included in a surface area of the first electrode 110, as shown in FIG. 1. Thus, the second electrode 130 may be positioned on the first insulation layer 120 over a central portion of the first electrode 110 and may not be positioned on the first insulation layer 120 over side portions of the first electrode 110. Hereinafter, the side portions of the first electrode 110 may be referred to first and second side portions L1 and L2 opposite to each other with respect to a line along the first direction, i.e., along the y-axis, and third and fourth side portions L3 and L4 opposite to each other with respect to another line along the second direction, i.e., the x-axis.

While the present example embodiment discloses that the second electrode 130 may be included in the surface area of the first electrode 110 on the first insulation layer 120. Thus, the second electrode 130 may not be positioned over all of the side portions of the first electrode 110, i.e., the second electrode 130 may be positioned merely over both of the side portions of the first electrode 110, as would be known to one of the ordinary skill in the art. Thus, the surface area of the second electrode 130 may be equal to or smaller than that of the first electrode 110.

The first electrode 110, the first insulation layer 120, and the second electrode 130 may function as a first capacitor. The first and the second electrodes 110 and 130 may include metal or metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The second insulation layer 140 may be positioned on the substrate 10 in the third direction such that the first electrode 110, the first insulation layer 120, and the second electrode 130 may be covered with the second insulation layer 140. The second insulation layer 140 may include silicon oxide, silicon nitride, or a high-k material. The composition material of the second insulation layer 140 may be different from that of the first insulation layer 120 or may be substantially the same as that of the first insulation layer 120.

The third insulation layer 190 may be positioned on the second insulation layer 140 and may include a first comb-shaped trench (not shown) in which the third electrode 170 may be positioned and a second comb-shaped trench (not shown) in which the fourth electrode 180 may be positioned. Thus, the third and fourth electrodes 170 and 180 may be shaped into a comb in accordance with the shape of the trenches of the third insulation layer 190.

The third comb-shaped electrode 170 may include a first common wiring 172 and a number of first branch wirings 174 electrically connected to the first common wiring 172. The first common wiring 172 may be shaped into a bar extending in the first direction, i.e., along the y-axis, and may be positioned in the third insulation layer 190 corresponding to the first side portion L1 of the first electrode 110. Thus, the first common wiring 172 may be positioned over the first side portion L1 of the first electrode 110 along the third direction, as shown in FIG. 2. Therefore, the third electrode 170 and the first electrode 110 may face each other at the first side portion L1 of the first electrode 110 separated by the first and the second insulation layers 120 and 140 along a z-axis, thereby forming another capacitor in an example of the present capacitor structure 100. While the present example embodiment discloses that the first common wiring 172 may be positioned over the first side portion L1 of the first electrode 110, the first common wiring structure 172 may also be positioned over the second electrode 130, as would be known to one of the ordinary skill in the art.

A plurality of the first branch wirings 174 may be shaped into another bar extending in the second direction and may be commonly connected to the first common wiring 172. Thus, the third electrode may be shaped into a comb having a body corresponding to the common wiring 172 and a plurality of teeth corresponding to the branch wirings 174. In the present example embodiment, the first branch wirings 174 may be positioned in the third insulation layer 190 over the second electrode 130 and may overlap the second electrode 130 in a surface area of the second electrode 130. The first branch wirings 174 may be spaced apart from each other and electrically insulated from each other by the third insulation layer 190. Thus, the third electrode 170 may be positioned in the third insulation layer 190 in such a configuration that the first common wiring 172 may be positioned over the first side portion L1 of the first electrode 110 and the first branch wirings 174 may be positioned over the second electrode 130.

The fourth comb-shaped electrode 180 may include a second common wiring 182 and a number of second branch wirings 184 electrically connected to the second common wiring 182. The second common wiring 182 may be shaped into a bar extending in the first direction, i.e., along the y-axis, and may be positioned in the third insulation layer 190 corresponding to the second side portion L2 of the first electrode 110. Thus, the second common wiring 182 may be positioned over the second side portion L2 of the first electrode 110, as shown in FIG. 2. Therefore, the fourth electrode 180 and the first electrode 110 may face each other at the second side portion L2 of the first electrode 110 separated by the first and the second insulation layers 120 and 140 along the third direction, i.e., the z-axis, thereby forming still another capacitor in an example of the present capacitor structure 100. While the present example embodiment discloses that the second common wiring 182 may be positioned over the second side portion L2 of the first electrode 110, the second common wiring structure 182 may also be positioned over the second electrode 130, as would be known to one of the ordinary skill in the art.

A plurality of the second branch wirings 184 may be shaped into another bar extending in the second direction and may be commonly connected to the second common wiring 182. Thus, the fourth electrode may be shaped into a comb having a body corresponding to the common wiring 182 and a plurality of teeth corresponding to the branch wirings 184. In the present example embodiment, the second branch wirings 184 may be positioned in the third insulation layer 190 over the second electrode 130 and the third and fourth side portions of the first electrode 110. That is, the second branch wirings 184 of the fourth electrode may overlap the second electrode 130 in a surface area of the second electrode 130 and may overlap with the third and fourth side portions of the first electrode 110.

The second branch wirings 184 may be spaced apart from each other and electrically insulated from each other by the third insulation layer 190. Thus, the fourth electrode 180 may be positioned in the third insulation layer 190 in such a configuration that the second common wiring 182 may be positioned over the second side portion L2 of the first electrode 110 and the second branch wirings 184 may be positioned over the second electrode 130 and the third and fourth side portions L3 and L4 of the first electrode 110.

Particularly, the third and fourth electrodes 170 and 180 may face each other in the third insulation layer 190 in such a configuration that the teeth of a pair of the combs facing each other are inserted into each other. Thus, each of the second branch wirings 184 may be positioned between the neighboring first branch wirings 174 and the first branch wirings 174 may be positioned between the neighboring second branch wirings 184 at a same gap distance d between the adjacent first and second branch wirings 174 and 184. That is, the first and the second branch wirings 174 and 184 may be alternately arranged with each other along the first direction, i.e., the y-axis, in the third insulation layer 190. The third and the fourth electrodes 170 and 180 may include metal or metal nitride.

The first plug 150 may penetrate through the second insulation layer 140 to electrically connect the second electrode 130 and the third electrode 170. Particularly, the first plug 150 may be connected to the first branch wirings 174 of the third electrode 170. In the present example embodiment, a plurality of the first plugs 150 may be arranged in each of the first branch wirings 174 along the second direction in the surface area of the second electrode 130.

The second plug 160 may extend through the second insulation layer 140 and the first insulation layer 120 to electrically connect the first electrode and the fourth electrode 180. Particularly, the second plug 160 may be electrically connected to the second branch wirings 184 of the fourth electrode 180. In the present example embodiment, a plurality of the second plugs 160 may be arranged in each of the second branch wirings 184 along the second direction in the third and fourth side portions L3 and L4 of the first electrode 110.

The third insulation layer 190 may electrically insulate the third and fourth electrodes 170 and 180 from each other. The third insulation layer 190 may include silicon oxide, silicon nitride, or a high-k material. The composition material of the third insulation layer 190 may be different from that of the second insulation layer 140 or may be substantially the same as that of the second insulation layer 140.

The third electrode 170, the third insulation layer 190, and the fourth electrode 180 may function as a second capacitor, i.e., a capacitor relying on overlap in the x-y plane rather than vertically. Further, the second electrode 130, the second insulation layer 140, and the fourth electrode 180 may function as a third capacitor, since the second branch wirings 184 of the fourth electrode 180 may be positioned over the second electrode 130.

In addition, when the first common wiring 172 of the third electrode is positioned over the first side portion L1 of the first electrode 110 that does not overlap the second electrode 120, the first electrode 110, the second insulation layer 140, and the third electrode 170 may function as a fourth capacitor.

According to the first example embodiment of the capacitor structure, a plurality of the capacitors may be provided in the capacitor structure by combinations of the insulation layer and electrodes, to thereby sufficiently increase the capacitance of the capacitor structure.

FIGS. 3A to 3E illustrate cross-sectional views of stages in a method for forming the capacitor structure shown in FIG. 2.

Figure 3A:
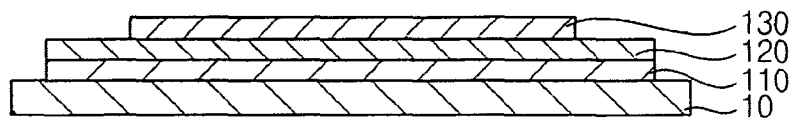
FIGS. 3A to 3E illustrate cross-sectional views of stages in a method of forming the capacitor structure shown in FIG. 2.

Referring to FIG. 3A, the semiconductor substrate 10 may be prepared and a plurality of unit conductive structures for a semiconductor device may be positioned on the substrate 10. For example, the unit conductive structures may include transistors, electrical resistors and capacitors, and unit conductive structures, e.g., a metal wiring structure of the semiconductor device. The substrate 10 may include an active region and a lower insulation layer (not shown) may be formed on the substrate 10. The lower insulation layer may include one of silicon oxide, silicon nitride, and combinations thereof. The lower insulation layer may include a multilayer in which a number of layers may be sequentially stacked on the substrate 10. An additional layer may be interposed between the substrate 10 and the lower insulation layer, as would be known to one of the ordinary skill in the art. A plug (not shown) may penetrate through the lower insulation layer to contact a portion of the substrate 10.

Then, the first electrode 110, the first insulation layer 120, and the second electrode 130 may be sequentially stacked on the substrate 10. Each of the first electrode 110, the first insulation layer 120 and the second electrode 130 may be formed on the substrate in the order named by a respective deposition process.

For example, the first electrode 110, the first insulation layer 120 and the second electrode 130 may each be formed as a plate. The second electrode 130 may overlap the first electrode 110 across the first insulation layer 120. In the present example embodiment, the second electrode 130 may be formed on a portion of the first insulation layer 120 corresponding to the surface area of the first electrode 110, and the second electrode 130 may not be positioned over the first to fourth side portions L1, L2, L3, and L4 of the first electrode 110. While the present example embodiment discloses that the second electrode 130 may be included in the surface area of the first electrode 110 on the first insulation layer 120 and thus the second electrode may not be positioned over all of the side portions of the first electrode 110, the second electrode 130 may be positioned merely over both of the side portions of the first electrode 110, as would be known to one of the ordinary skill in the art. Thus, the surface area of the second electrode 130 may be equal to or smaller than that of the first electrode 110.

Figure 3B:
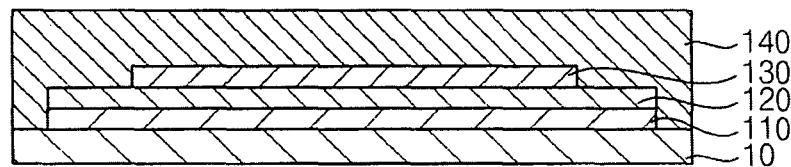

Referring to FIG. 3B, the second insulation layer 140 may be formed on the substrate 10 to a sufficient thickness to cover the first electrode 110, the first insulation layer 120, and the third electrode 130.

Figure 3C:
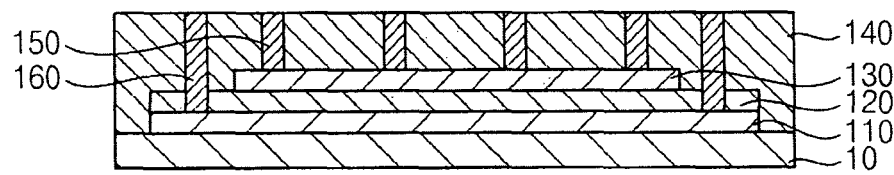

Referring to FIG. 3C, the second insulation layer 140 may be removed partially from the substrate 10 to thereby form a plurality of first holes (not shown) through which the second electrode 130 may be exposed. Further, the second insulation layer 140 and the first insulation layer 120 may be sequentially removed from the substrate 10 to thereby form a plurality of second holes (not shown) through which the first electrode 110 may be exposed. In the present example embodiment, a plurality of the first holes may be formed into a first hole-chain extending along the second direction in which each of the first holes may be spaced apart from each other by a predetermined distance. A number of the first hole-chains may be arranged at a portion of the second insulation layer 140 except side portions corresponding to the first to fourth side portions L1 to L4 of the first electrode 110. Each of the first hole-chains may be spaced apart from each other in the first direction. A plurality of the second holes may be formed into a second hole-chain extending along the second direction in which each of the second holes may be spaced apart from each other by a predetermined distance. A pair of the second hole-chains may be arranged at the side portions of the second insulation layer 140 corresponding to the third and fourth side portions L3 and L4 of the first electrode 110, respectively.

A conductive layer (not shown) may be formed on the second insulation layer 140 to a sufficient thickness to fill the first and second holes by depositing metal or metal nitride onto the second insulation layer 140. Then, the conductive layer may be planarized by a planarization process until an upper surface of the second insulation layer 140 is exposed. Therefore, the conductive layer may remain only in the first and second holes to thereby form the first plug 150 in the first holes and the second plug 160 in the second holes. The planarization process may include a CMP process, an etch-back process, and a grinding process.

The first plug 150 in the first hole may penetrate through the second insulation layer 140 to contact to the second electrode 130. The second plug in the second hole may penetrate through the first and second insulation layers 120 to contact the first electrode 110. In the present example embodiment, a plurality of the first plugs 150 may be arranged at a portion of the substrate 10 corresponding to the surface area of the second electrode 130 to thereby form first plug chains each of which may extend in the second direction. Likewise the first hole-chains, a number of the first plug chains may be arranged in the first direction and each of the first plug chains may be spaced apart from each other by a predetermined distance in the first direction. A plurality of the second plugs 160 may be arranged at upper and lower side portions of the substrate 10 corresponding to the third and fourth side portions L3 and L4 of the first electrode 110, to thereby form a pair of second plug chains which may extend in the second direction.

Figure 3D:
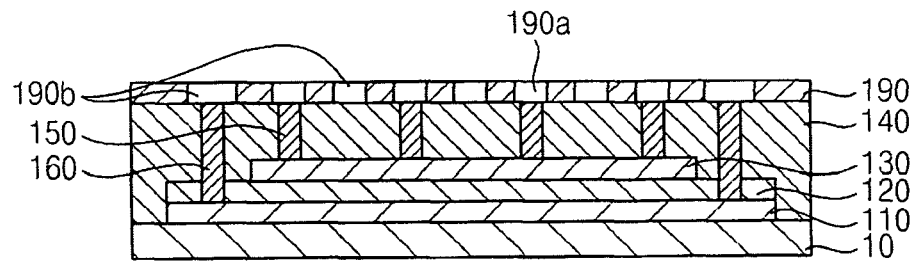

Referring to FIG. 3D, the third insulation layer 190 may be formed on the second insulation layer 140 and on the first and second plug chains. Then, the third insulation layer 190 may be partially etched off the second insulation layer 140, to thereby form a first trench 190a through which the first plug chain including the first plugs 150 may be exposed and form a second trench 190b through which the first plug chain including the second plugs 160 may be exposed.

For example, the first and the second trenches 190a and 190b may be formed into a pair of combs facing each other. That is, the third insulation layer 190 may be partially etched off at a first side portion corresponding to the first side portion L1 of the first electrode 110 in the first direction, to thereby form a first vertical trench. Then, the third insulation layer 190 may be further etched off in the second direction from the first vertical trench in accordance with the first plug chains to thereby form a plurality of first horizontal trenches. Thus, the second insulation layer 140 may be exposed through the first vertical trench, and both of the second insulation layer 140 and the first plug chains may be exposed through the first horizontal trenches. The first horizontal trenches may be connected to the first vertical trench and may be spaced apart from each other by a predetermined distance in the first direction according to the configuration of the first plug chains. The first trench 190a may include the first vertical trench and a number of the first horizontal trenches.

In a similar way, the third insulation layer 190 may be partially etched off at the second side portion, opposite to the first side portion L1, corresponding to the second side portion L2 of the first electrode 110, in the first direction to thereby form a second vertical trench. Then, the third insulation layer 190 may be further etched off the second vertical trench in the second direction to thereby form a plurality of second horizontal trenches between the first horizontal trenches.

Particularly, upper and lower second horizontal trenches may be formed along the second plug chains at the upper and lower side portions corresponding to the third and fourth side portions of the first electrode 110. Remaining second horizontal trenches may be formed alternately with the first horizontal trenches over the second electrode 130. Thus, the second insulation layer 140 may be exposed through the second vertical trench at the second side portion of the third insulation layer 190 and through the second horizontal trenches over the second electrode 130. Further, the second plug chains may be exposed through the upper and lower second horizontal trenches at areas of the third insulation layer 190 corresponding to the third and fourth side portions L3 and L4 of the first electrode 110. The second horizontal trenches may be connected to the second vertical trench and may be spaced apart from the first horizontal trenches, respectively. The second trench 190b may include the second vertical trench and a number of the second horizontal trenches. Therefore, the first and second trenches 190a and 190b may be formed as a pair of the combs facing each other in which the teeth of the combs may cross each other, as may be seen in the plan view with reference to FIG. 1.

Figure 3E:
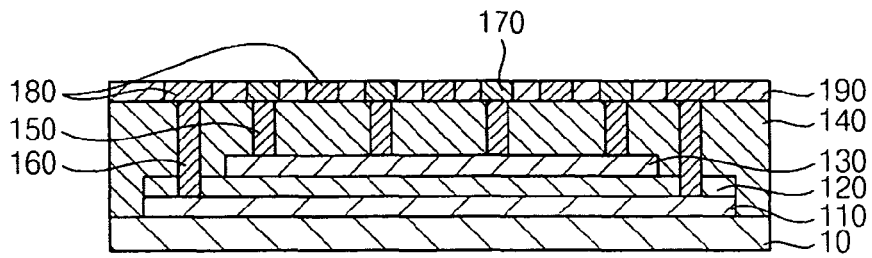

Referring to FIG. 3E, another conductive layer (not shown) may be formed on the third insulation layer 190 to a sufficient thickness to fill up the first and second trenches 190a and 190b. Then, the conductive layer may be planarized until an upper surface of the third insulation layer 190 is exposed. Thus, the conductive layer may remain only in the first and second trenches 190a and 190b to thereby form the comb-shaped third electrode 170 in the first trenches 190a and the comb-shaped fourth electrode 180 in the second trenches 190b.

In the present example embodiment, the third electrode 170 may include the first common wiring 172 in the first vertical trench and a plurality of the first branch wirings 174, each of which may be commonly connected to the first common wiring 172 and extends in the second direction. The first branch wirings 174 may be electrically connected to the first plug chains, respectively. Thus, the first plugs 150 in the same plug chain may make simultaneous contact with the first branch wirings 174, respectively.

The fourth electrode 180 may include the second common wiring 182 in the second vertical trench and a plurality of the second branch wirings 184, each of which may be commonly connected to the second common wiring 182 and extends in the second direction. The first and second branch wirings 174 and 184 may be inserted into each other in the second direction in a portion of the third insulation layer 190 over the second electrode 130. Further, the second branch wirings 184 may be electrically connected to the second plug chains at another portion of the third insulation layer 190 corresponding to the third and fourth side portions L3 and L4 of the first electrode 110.

The third and fourth electrodes 170 and 180 may have the same structure and configuration as described with reference to FIG. 1. Thus, any further detailed descriptions on the third and fourth electrodes 170 and 180 will not be repeated. Therefore, the first capacitor structure 100 may be formed on the substrate 10.

The first to the fourth electrodes 110, 130, 170 and 180 may include a metal or a metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The first, the second, and the third insulation layers 120, 140, and 190 may include silicon nitride or a high-k material. Examples of the high-k material may include tantalum oxide (TaO), hafnium oxide (HfO) and combinations thereof. The composition material of the first, the second, and the third insulation layers 120, 140, and 190 may be different or the same.

In the present example of the first capacitor structure 100, the first electrode 110, the first insulation layer 120, and the second electrode 130 may function as a first capacitor, and the third electrode 170, the third insulation layer 190, and the fourth electrode 180 may function as a second capacitor. Further, the second electrode 130, the second insulation layer 140, and the fourth electrode 180 may function as a third capacitor.

In addition, when the first common wiring 172 is arranged on a portion of the second insulation layer 140 at the first side portion of the substrate 10 and does not overlap the second electrode 120 over the first electrode 110, then the first electrode 110, the second insulation layer 140, and the third electrode 170 may function as a fourth capacitor.

Accordingly, a plurality of the capacitors may be provided in the capacitor structure by combinations of the insulation layer and electrodes, to thereby sufficiently increase the capacitance of the capacitor structure.

Figure 4:
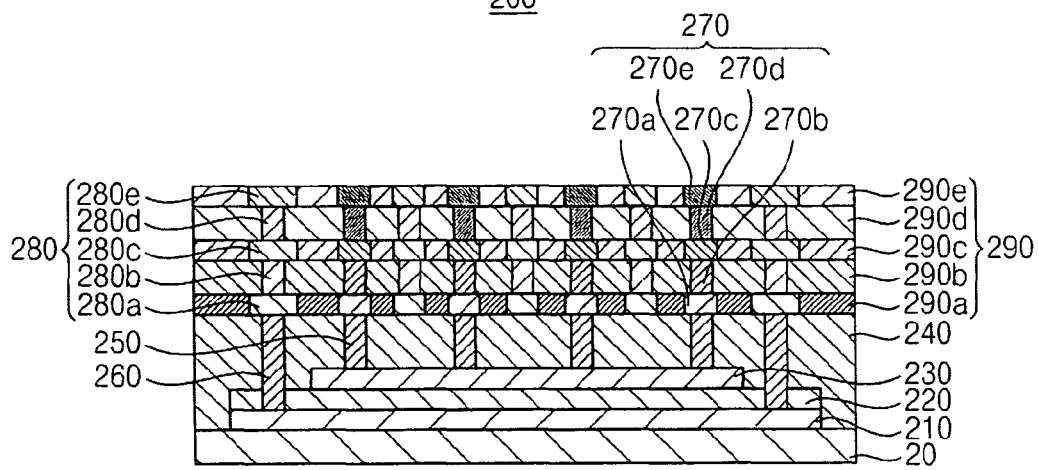
FIG. 4 illustrates a cross-sectional view of a first modification of the capacitor structure in accordance with another example embodiment of the present inventive concept.

FIG. 4 illustrates a cross-sectional view of a first modification of the capacitor structure in accordance with another example embodiment of the present inventive concept. Referring to FIG. 4, a first modified capacitor structure 200 in accordance with another example embodiment of the inventive concept may include a first electrode 210, a first insulation layer 220, a second electrode 230, a second insulation layer 240, a first plug 250, a second plug 260, a third electrode 270, a fourth electrode 280, and a third insulation layer 290.

The first modified capacitor structure 200 of the present example embodiment may have substantially the same structure as the first capacitor structure 100 described with reference to FIGS. 1 and 2, except that the third and the fourth electrodes 270 and 280 may have multi-layered structure in which unit layers may be connected to each other via plugs. Thus, the substrate 20 on which the modified capacitor structure 200 is formed, the first electrode 210, the first insulation layer 220, the second electrode 230, the second insulation layer 240, the first plug 250, and the second plug 260 may have substantially the same structure as the substrate 10, the first electrode 110, the first insulation layer 120, the second electrode 130, the second insulation layer 140, the first plug 150, and the second plug 160 of the first capacitor structure 100 detailed described with reference to FIGS. 1 and 2. Therefore, any further detailed descriptions on the substrate 20, the first electrode 210, the first insulation layer 220, the second electrode 230, the second insulation layer 240, the first plug 250, and the second plug 260 will not be repeated below.

In an example embodiment, the third insulation layer 290 may include five unit layers 290a, 290b, 290c, 290d, and 290e that are sequentially stacked on the substrate 10. The third electrode 270 may include a first-layered third electrode 270a in the first unit layer 290a, a first lower via plug 270b in the second unit layer 290b, a second-layered third electrode 270c in the third unit layer 290c, a first upper via plug 270d in the fourth unit layer 290d, and a third-layered third electrode 270e in the fifth unit layer 290e that are electrically connected with one another. The fourth electrode 280 may include a first-layered fourth electrode 280a in the first unit layer 290a, a second lower via plug 280b in the second unit layer 290b, a second-layered fourth electrode 280c in the third unit layer 290c, a second upper via plug 280d in the fourth unit layer 290d, and a third-layered fourth electrode 280e in the fifth unit layer 290e that are electrically connected with one another.

Since the surface area of the third and the fourth electrodes 270 and 280 may be increased, the capacitance of the first modified capacitor structure 200 may be significantly increased.

Figure 5A:
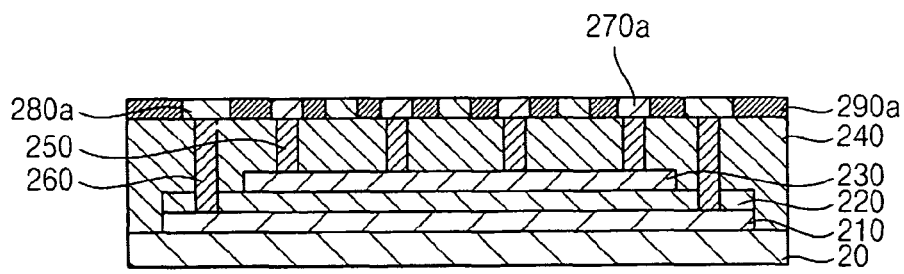
FIGS. 5A to 5C illustrate cross-sectional views of stages in a method of forming the first modification of the capacitor structure shown in FIG. 4.
Figure 5B:
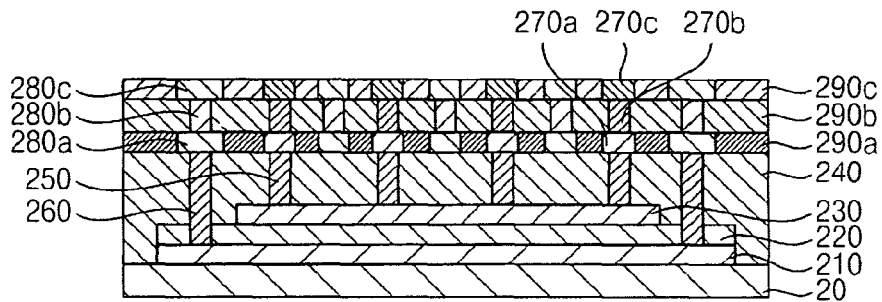
Figure 5C:
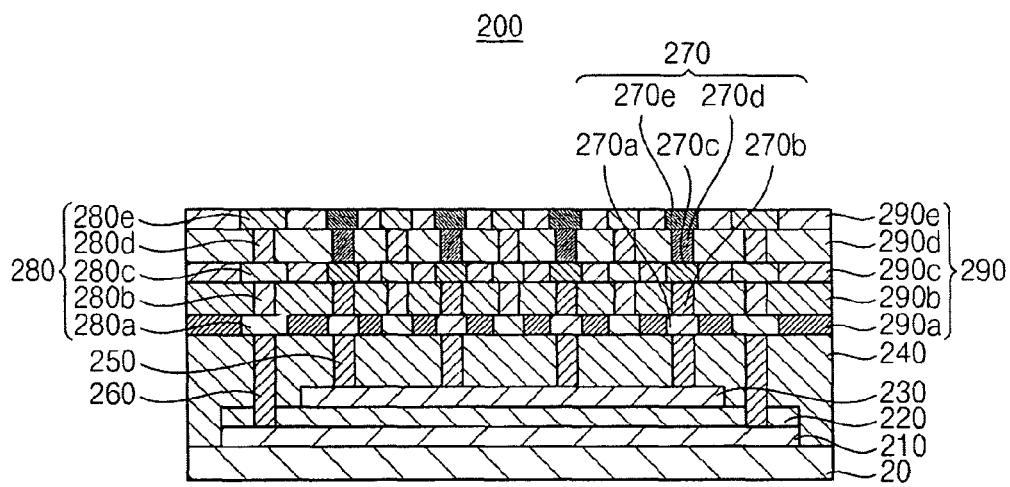

FIGS. 5A to 5C illustrate cross-sectional views of stages in a method of forming the first modification of the capacitor structure shown in FIG. 4.

Referring to FIG. 5A, the first electrode 210, the first insulation layer 220, the second electrode 230, the second insulation layer 240, the first plug 250, the second plug 260, the first unit layer 290a of the third insulation layer 290, the first-layered third electrode 270a of the third electrode 270 and the first-layered fourth electrode 280a of the fourth electrode 280 may be formed on the substrate by the same process as described with reference to FIGS. 3A to 3D for forming the first electrode 110, the first insulation layer 120, the second electrode 130, the second insulation layer 140, the first plug 150, the second plug 160, the third insulation layer 190, the third electrode 170, and the fourth electrode 180 on the substrate 10. Thus, any further detailed descriptions for forming the first electrode 210, the first insulation layer 220, the second electrode 230, the second insulation layer 240, the first plug 250, the second plug 260, the first unit layer 290a of the third insulation layer 290, the first-layered third electrode 270a of the third electrode 270, and the first-layered fourth electrode 280a of the fourth electrode 280 will be omitted.

Referring to FIG. 5B, the second unit layer 290b of the third insulation layer 290 may be formed on the first unit layer 290a and on the first-layered third and fourth electrodes 270a and 280a. Then, the second insulation layer 290b may be etched off the first unit layer 290a to thereby form a plurality of openings (not shown) through which the first-layered third and fourth electrodes 270a and 280a are exposed.

Another conductive layer including a metal or a metal nitride may be formed on the second unit layer 290b to a sufficient thickness to fill the openings of the second unit layer 290b and then may be planarized by a planarization process until an upper surface of the second unit layer 290b is exposed. Therefore, the first and the second lower via plugs 270b and 280b may be formed in the openings of the second unit layer 290b of the third insulation layer 290. In the present example embodiment, a plurality of the first lower via plugs 270b may come into contact with the first-layered third electrode 270a, respectively, and a plurality of the second lower via plugs 280b may come into contact with the first-layered fourth electrode 280a, respectively.

Thereafter, the third unit layer 290c of the third insulation layer 290 may be formed on the second unit layer 290b and on the first and second lower via plugs 270b and 280b. Then, the third insulation layer 290c may be etched off the second unit layer 290b to thereby form trenches (not shown) through which the first and the second lower via plugs 270b and 280b are exposed, respectively. In the present example embodiment, a pair of the comb-shaped trenches facing each other may be formed in the third unit layer 290c of the third insulation layer 290 by the same process as described with reference to FIG. 3D. Therefore, a plurality of the first and the second lower via plugs 270b and 280b may be exposed through the comb-shaped trenches.

Another conductive layer including a metal or a metal nitride may be formed on the third unit layer 290c to a sufficient thickness to fill the comb-shaped trenches of the third unit layer 290c, and then may be planarized by a planarization process until an upper surface of the third unit layer 290c is exposed. Therefore, the second-layered third and fourth electrodes 270c and 280c may be formed in the comb-shaped trenches of the third unit layer 290c of the third insulation layer 290. In the present example embodiment, a plurality of the first lower via plugs 270b may come into contact with the second-layered third electrode 270c, respectively, and a plurality of the second lower via plugs 280b may come into contact with the second-layered fourth electrode 280c, respectively.

Referring to FIG. 5C, the fourth unit layer 290d of the third insulation layer 290 may be formed on the third unit layer 290c and on the second-layered third and fourth electrodes 270c and 280c, and then the fourth insulation layer 290d may be etched off from the third unit layer 290c to thereby form a plurality of openings (not shown) through which the second-layered third and fourth electrodes 270c and 280c may be exposed.

Another conductive layer including a metal or a metal nitride may be formed on the fourth unit layer 290d to a sufficient thickness to fill up the openings of the fourth unit layer 290d and then may be planarized by a planarization process until an upper surface of the fourth unit layer 290d is exposed. Therefore, the first and the second upper via plugs 270d and 280d may be formed in the openings of the fourth unit layer 290d of the third insulation layer 290. In the present example embodiment, a plurality of the first upper via plugs 270d may come into contact with the second-layered third electrode 270c, respectively, and a plurality of the second upper via plugs 280d may come into contact with the second-layered fourth electrode 280c, respectively.

Thereafter, the fifth unit layer 290e of the third insulation layer 290 may be formed on the fourth unit layer 290d and on the first and the second upper via plugs 270d and 280d. Then, the fifth insulation layer 290e may be etched off the fourth unit layer 290d to thereby form trenches (not shown) through which the first and the second upper via plug 270d and 280d are exposed. In the present example embodiment, a pair of the comb-shaped trenches facing each other may be formed in the fifth unit layer 290e of the third insulation layer 290 by the same process as described with reference to FIG. 3D. Therefore, a plurality of the first and the second upper via plugs 270d and 280d may be exposed through the comb-shaped trenches.

Another conductive layer including a metal or a metal nitride may be formed on the fifth unit layer 290e to a sufficient thickness to fill the comb-shaped trenches of the fifth unit layer 290e, and then may be planarized by a planarization process until an upper surface of the fifth unit layer 290e is exposed. Therefore, the third-layered third and fourth electrodes 270e and 280e may be formed in the trenches of the fifth unit layer 290e of the third insulation layer 290. In the present example embodiment, a plurality of the first upper via plugs 270d may come into contact with the third-layered third electrode 270e, respectively, and a plurality of the second upper via plugs 280d may come into contact with the third-layered fourth electrode 280e, respectively.

Accordingly, the first to fifth unit layers 290a to 290e may constitute the third insulation layer 290 in the first modified capacitor structure 200. The first-layered third electrode wiring 270a, the first lower via plug 270b, the second-layered third electrode 270c, the first upper via plug 270d, and the third-layered third electrode 270e may constitute the third electrode 270 in the first modified capacitor structure 200. The first-layered fourth electrode 280a, the second lower via plug 280b, the second-layered fourth electrode 280c, the second upper via plug 280d, and the third-layered fourth electrode 280e may constitute the fourth electrode 280 in the first modified capacitor structure 200. Thus, a plurality of the capacitors may be provided in the capacitor structure by combinations of the insulation layer and electrodes, to thereby sufficiently increase the capacitance of the capacitor structure.

Figure 6:
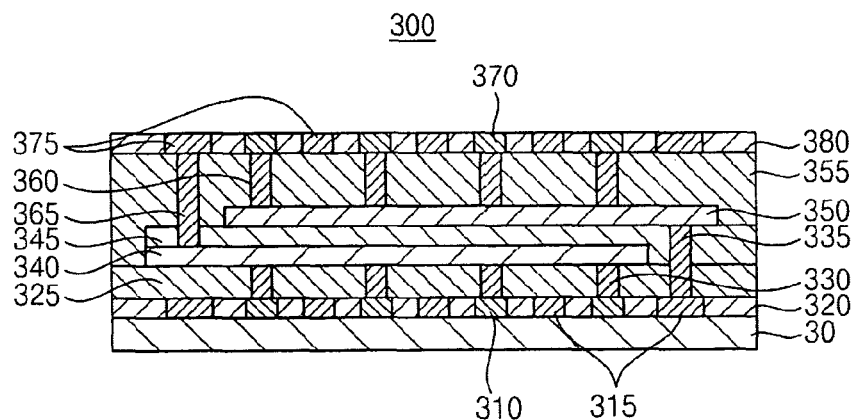
FIG. 6 illustrates a cross-sectional view of a second modification of the capacitor structure in accordance with still another example embodiment of the present inventive concept.

FIG. 6 illustrates a cross-sectional view of a second modification of the capacitor structure in accordance with still another example embodiment of the present inventive concept. Referring to FIG. 6, a second modified capacitor structure 300 in accordance with still another example embodiment of the inventive concept may include a first electrode 310, a second electrode 315, a first insulation layer 320, a second insulation layer 325, a first plug 330, a second plug 335, a third electrode 340, a third insulation layer 345, a fourth electrode 350, a fourth insulation layer 355, a third plug 360, a fourth plug 365, a fifth electrode 370, a sixth electrode 375, and a fifth insulation layer 380.

In an example embodiment, the first and second electrodes 310 and 315 may be formed on a substrate 30. The substrate 30 and the first and the second electrodes 310 and 315 may be the same structure as the substrate 10, the third electrode 170, and the fourth electrode 180 in the first capacitor structure 100 as described in detail with reference to FIGS. 1 and 2. Thus, the first and second electrodes 310 and 315 may constitute a pair of combs facing each other and the teeth of the combs may be alternately arranged with each other. The outermost teeth of the second electrode 315 may be positioned on the upper and lower side portions of the substrate, respectively.

The first insulation layer 320 may be formed on the semiconductor substrate 30, and the first and the second electrodes 310 and 315 may be exposed through the first insulation layer 320. Thus, the first and the second electrodes 310 and 315 may be electrically insulated from each other by the first insulation layer 320.

The second insulation layer 325 may be formed on the first insulation layer 320. Thus, the first and the second electrodes 310 and 315 may be electrically connected to the plugs penetrating through the second insulation layer 325.

The third electrode 340 may be arranged on the second insulation layer 325 and may be shaped into a plate. In the present example embodiment, the third electrode 340 may overlap the second electrode 315 at an upper side portion of the substrate 30 and may not overlap the second electrode 315 at a lower side portion of the substrate 30. Thus, the plate-shaped third electrode 340 may make contact with the second insulation layer 325 in such a configuration that the third electrode 340 may be positioned over the upper teeth of the second electrode 315 and may not be positioned over the lower teeth of the second electrode 315.

The third insulation layer 345 may be formed on the third electrode 340 and the second insulation layer 325. That is, the third electrode 340 may be covered with the third insulation layer 345 and the second insulation layer 325 at the lower portion of the substrate 30 may be covered with the third insulation layer 345. The second insulation layer 325 at the upper portion of the substrate 30 may be covered with the fourth insulation layer 355, as described below. Thus, the third insulation layer 345 and the second insulation layer 325 may make contact with each other at the lower portion of the substrate 30.

The fourth electrode 350 may be arranged on the third insulation layer 345 and may be shaped into a plate. In the present example embodiment, the fourth electrode 350 may overlap the second electrode 315 at the lower side portion of the substrate 30 and may not overlap the second electrode 315 at the upper side portion of the substrate 30. Thus, the plate-shaped fourth electrode 350 may make contact with the third insulation layer 345 in such a configuration that the fourth electrode 350 may be positioned over the lower teeth of the second electrode 315 and may not be positioned over the upper teeth of the second electrode 315.

Therefore, the fourth electrode 350 and the third electrode 340 may partially overlap each other in such a configuration that the fourth electrode 350 may be connected to the second plug 335 at the lower portion of the substrate 30 and the third electrode 340 may be connected to the fourth plug 365 at the upper portion of the substrate 30. Thus, relative to the z-axis, a lower surface of the fourth electrode 350 may be directed downward to the second electrode 315 and an upper surface of the third electrode 340 may be directed upward to the sixth electrode 375. In the present example embodiment, the third and the fourth electrodes 340 and 350 may have the same surface area. However, the third and the fourth electrodes 340 and 350 may have different surface area, as would be known to one of the ordinary skill in the art.

The first plug 330 may penetrate through the second insulation layer 325 in such a configuration that the first and third electrodes 310 and 340 may be electrically connected to each other. The second plug 335 may penetrate through the second and the third insulation layers 325 and 345 in such a configuration that the second and fourth electrodes 315 and 350 may be electrically connected to each other at the lower side portion of the substrate 30.

The fourth insulation layer 355 may be arranged on the substrate 30 including the fourth electrode 350 in such a configuration that the fourth electrode 350 may be covered with the fourth insulation layer 355 and the first and the second insulation layers 325 and 345 make contact with the fourth insulation layer 355 at the upper portion of the substrate 30, while the second insulation layer 345 makes contact with the fourth insulation layer 355 at the lower portion of the substrate 30.

The fifth electrode 370 and the sixth electrode 375 may be arranged in the fourth insulation layer 355. In the present example embodiment, the fifth electrode 370 and the sixth electrode 375 may be shaped into a pair of the combs facing each other like the third electrode 170 and the fourth electrode 180 in the capacitor structure described in detail with reference to FIGS. 1 and 2. Thus, the teeth of the combs may be alternately arranged with each other from the upper side portion to the lower side portion of the substrate 30. The upper and lower teeth of the fifth electrode 375 may be positioned on the upper and lower side portions of the substrate, respectively. Any further detailed descriptions on the fifth and sixth electrodes 370 and 375 will be omitted.

The third plug 360 may penetrate through the fourth insulation layer 355 to electrically connect the fourth and the fifth electrodes 350 and 370. The fourth plug 365 may penetrate through the fourth and the third insulation layers 355 and 345 in to electrically connect the third and the sixth electrodes 340 and 375.

For example, the fifth and the sixth electrodes 370 and 375 may be electrically insulated for each other by the fifth insulation layer 380 on the fourth insulation layer 355. In the present embodiment, the fifth and the sixth electrodes 370 and 375 may be arranged according to comb-shaped trenches of the fifth insulation layer 380.

For example, the electrodes 310, 315, 340, 350, 370, and 375, and the plugs 330, 335, 360, and 365 may include a metal and a metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The first to fifth insulation layers 320, 325, 345, 355, and 380 may include silicon oxide, silicon nitride, or a high-k material. Examples of the high-k material may include tantalum oxide (TaO), hafnium oxide (HfO), and combinations thereof. The composition material of the first to fifth insulation layers 320, 325, 345, 355, and 380 may be different from one another or may be the same.

In addition, the first and the second electrodes 310 and 315 and the fifth and the sixth electrodes 370 and 375 may include vertically stacked metal wirings and via plugs interconnecting the stacked metal wirings.

According to the above example embodiment of the second modified capacitor structure, the first electrode 310, the first insulation layer 320, and the second electrode 315 may function as a first capacitor. Further, when the third electrode 340 is positioned on the second insulation layer 325 over the second electrode 315 at the upper side portion of the substrate 30, then the second electrode 315, the second insulation layer 325, and the third electrode 340 may function as a second capacitor at the upper side portion of the substrate 30. The third electrode 340, the third insulation layer 345, and the fourth electrode 350 may function as a third capacitor. In addition, when the sixth electrode 375 is positioned on the fourth insulation layer 355 over the fourth electrode 350 at the lower side portion of the substrate 30, then the sixth electrode 375, the fourth insulation layer 355, and the fourth electrode 350 may function as a fourth capacitor. The fifth electrode 370, the fifth insulation layer 380, and the sixth electrode 375 may function as a fifth capacitor.

Accordingly, a number of the capacitors may be arranged in the second modified capacitor structure 300, to thereby increase the capacitance per unit area of the second modified structure.

FIGS. 7A to 7I illustrate cross-sectional view of stages in a method of forming the second modification of the capacitor structure shown in FIG. 6.

Figure 7A:
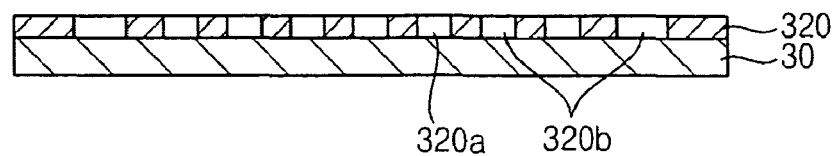
FIGS. 7A to 7I illustrate cross-sectional view of stages in a method of forming the second modification of the capacitor structure shown in FIG. 6.

Referring to FIG. 7A, the first insulation layer 320 may be formed on the substrate 30. Then, the first insulation layer 320 may be etched off from the substrate 30 to thereby form first and second trenches 320a and 320b. The first and second trenches 320a and 320b may be formed into a pair of combs facing each other in view point of a plane figure in such a manner that the teeth of the combs may alternately arranged along the first direction.

Figure 7B:
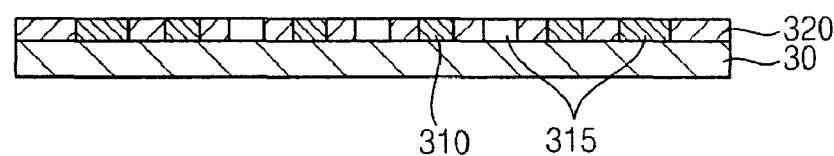

Referring to FIG. 7B, a conductive layer including a metal or a metal nitride may be formed on the first insulation layer 320 to a sufficient thickness to fill the comb-shaped first and second trenches 320a and 320b, and then may be planarized by a planarization process until an upper surface of the first insulation layer 320 is exposed. Therefore, the first electrode 310 and the second electrode 315 may be formed in the first and second trenches 320a and 320b of the first insulation layer 320. For example the planarization process may include a chemical mechanical polishing (CMP) process, an etch-back process and a grinding process.

Thus, the first electrode 310 may be formed in the first trench 320a of the first insulation layer 320 in the shape of a comb and the second electrode 315 may be formed in the second trench 320b of the first insulation layer 320 in the shape of a comb. In a similar process as described with reference to FIGS. 3D to 3E, the first and second electrodes 310 and 315 may be formed into a common wiring extending in the first direction and a number of branch wirings making contact with the common wiring and extending in the second direction. The common wiring may correspond to a body of the comb and the branch wiring may correspond to the teeth of the comb. In the present example embodiment, the comb-shaped first and second electrodes 310 and 315 may be formed to face each other in the first insulation layer 320. Thus the branch wirings of the first and second electrodes 310 and 315 may be alternately arranged with each other and may be spaced apart from each other along the first direction.

Figure 7C:
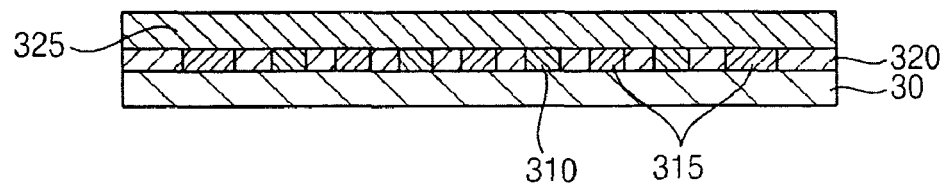

Referring to FIG. 7C, the second insulation layer 325 may be formed on the first insulation layer 320 including the first and the second electrodes 310 and 315.

Figure 7D:
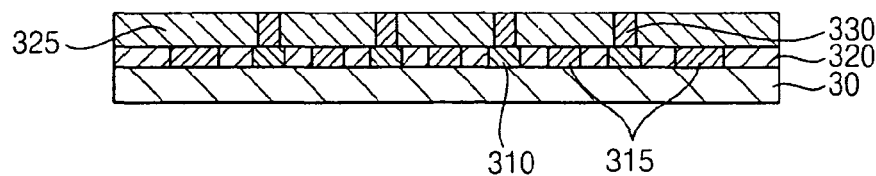

Referring to FIG. 7D, the second insulation layer 325 may be partially etched off the first insulation layer 320, to thereby form a plurality of openings (not shown) through which the branch wirings of the first electrode 320 may be exposed. Then, another conductive layer, e.g., including a metal or a metal nitride, may be formed on the second insulation layer 325 to a sufficient thickness to fill the openings of the second insulation layer 325, and then may be planarized by a planarization process until an upper surface of the second insulation layer 325 is exposed. Therefore, a plurality of the first plugs 330 may be formed in the openings of the second insulation layer 325 and come into contact with the branch wirings of the first comb-shaped electrode 310, respectively.

Figure 7E:
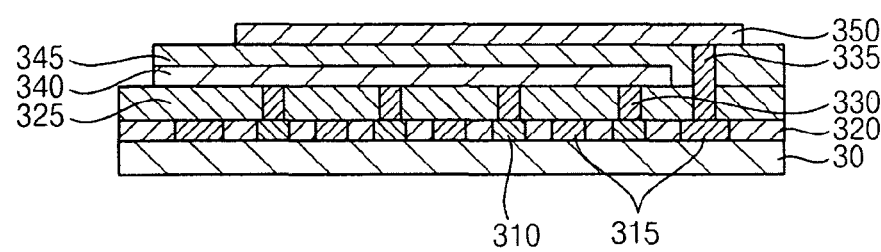

Referring to FIG. 7E, the third electrode 340 may be formed on the second insulation layer 325 including the first plugs 330. In the present embodiment, the third electrode 340 may be formed into a plate shape in such a manner that the teeth of the first comb-shaped electrode 310 and the teeth of the second comb-shaped electrode 315 except a bottom tooth thereof may overlap the third electrode 340. Since no plug is connected to the top tooth of the second comb-shaped electrode 315 through the second insulation layer 325, the third electrode 340 may merely be connected to the first electrode 310 through the first plugs 330.

Thereafter, the third insulation layer 345 may be formed on the third electrode 340 and on a lower portion of the second insulation layer 325. Thus, the bottom teeth of the second comb-shaped electrode 315 may be covered with both of the second and third insulation layers 325 and 345. Then, the third and the second insulation layers 345 and 325 may be sequentially partially etched off from substrate 30, to thereby form openings through which the bottom tooth of the comb-shaped second electrode 315 are exposed.

Then, another conductive layer, e.g., including a metal or a metal nitride, may be formed on the third insulation layer 345 to a sufficient thickness to fill the openings of the third and the second insulation layers 345 and 325, and then may be planarized by a planarization process until an upper surface of the third insulation layer 345 is exposed. Therefore, a plurality of the second plugs 335 may be formed in the openings of the third and second insulation layers 345 and 325 and come into contact with the bottom tooth of the second comb-shaped electrode 315.

The fourth electrode 350 may be formed on the third insulation layer 345 including the second plugs 335. In the present embodiment, the fourth electrode 350 may be formed into a plate shape in such a manner that the teeth of the first comb-shaped electrode 310 and the teeth of the second comb-shaped electrode 315, except a top tooth thereof may overlap the fourth electrode 350. Thus, the fourth electrode 350 may not be positioned over the top tooth and may be positioned over the bottom tooth of the second comb-shaped electrode 315 in such configuration that the fourth electrode 350 may only be connected to the bottom tooth of the second comb-shaped electrode 315 through the second plugs 335.

Accordingly, while the third electrode 340 may be relatively biased to an upper portion of the substrate 30, the fourth electrode 350 may be relatively biased to a lower portion of the substrate 30. Thus, the third and the fourth electrodes 340 and 350 may partially overlap separated by the third insulation layer 345 in such a manner that a lower surface of the fourth electrode 350 may face downwards along the z-axis at the lower portion of the substrate 30 and an upper surface of the third electrode 340 may face upwards at the upper portion of the substrate 30. In the present example embodiment, the third and the fourth electrodes 340 and 350 may have the same or different surface area.

Figure 7F:
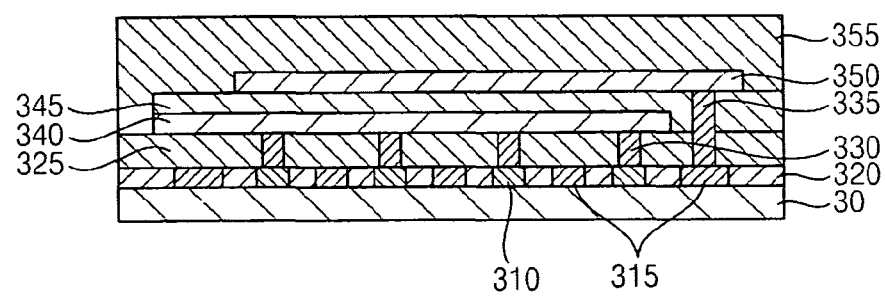

Referring to FIG. 7F, the fourth insulation layer 355 may be formed on the resultant structure including the third and fourth electrodes 340 and 350. Thus, the second insulation layer 325, the third insulation layer 345, and the third and the fourth electrodes 340 and 350 may be covered with the fourth insulation layer 355. Therefore, the third electrode 340 may be covered with both of the third and the fourth insulation layers 345 and 355 at the upper portion of the substrate 30.

Figure 7G:
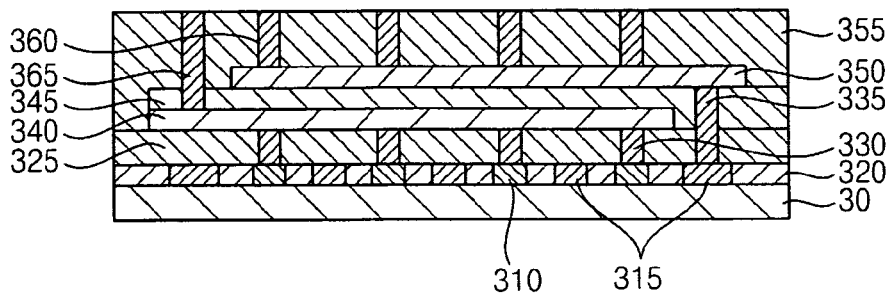

Referring to FIG. 7G, the fourth insulation layer 355 may be partially etched off from the substrate 30, to thereby form openings through which the fourth electrode 350 overlapping with the teeth of the first comb-shaped electrode 310 are partially exposed. In addition, the fourth and the third insulation layers 355 and 345 may be sequentially etched off from the substrate 30, to thereby form openings through which the third electrode 340 overlapping the top tooth of the second comb-shaped electrode 315 are partially exposed.

Then, another conductive layer including a metal or a metal nitride may be formed on the fourth insulation layer 355 to a sufficient thickness to fill the openings of the fourth and the third insulation layers 355 and 345, and then may be planarized by a planarization process until an upper surface of the fourth insulation layer 355 is exposed. Therefore, a plurality of the third plugs 360 may be formed in the openings of the fourth insulation layer 355 and come into contact with the fourth plate electrode 350. In addition, a plurality of the fourth plugs 365 may be formed in the openings of the fourth and third insulation layers 355 and 345 and come into contact with the third plate electrode 340 at the upper side portion of the substrate 30.

Figure 7H:
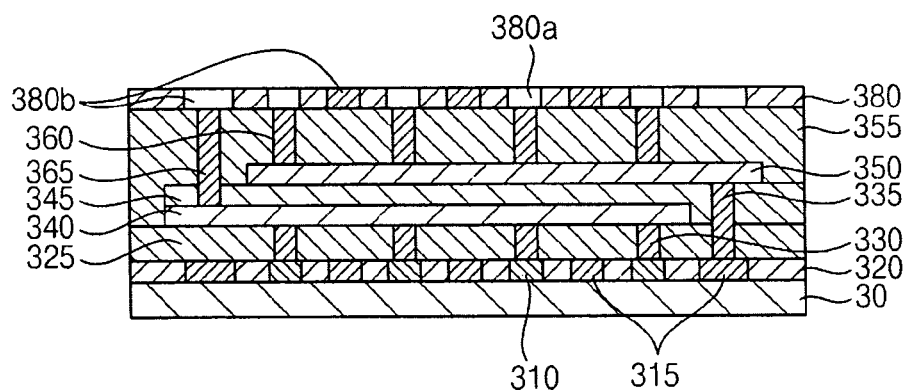

Referring to FIG. 7H, the fifth insulation layer 380 may be formed on the fourth insulation layer 355 and may be partially etched off from the fourth insulation layer 355 to thereby form a third trench 380a though which the third plugs are exposed and a fourth trench 380b through which the fourth plugs are exposed in the fifth insulation layer 380. Likewise the first and the second trenches 320a and 320b of the first insulation layer 320, the third and fourth trenches 380a and 380b may be formed into a pair of combs facing each other in view point of a plane figure in such a manner that the teeth of the combs may alternately arranged along the first direction.

Figure 7I:
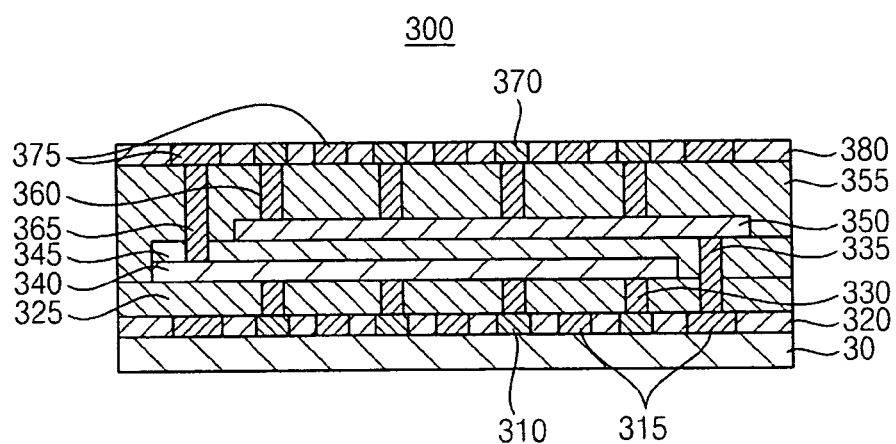

Referring to FIG. 7I, another conductive layer including a metal or a metal nitride may be formed on the fifth insulation layer 380 to a sufficient thickness to fill up the comb-shaped third and fourth trenches 380a and 380b, and then may be planarized by a planarization process until an upper surface of the fifth insulation layer 380 is exposed. Therefore, the fifth electrode 370 and the sixth electrode 375 may be formed in the third and fourth trenches 380a and 380b of the fifth insulation layer 380, respectively.

Thus, the fifth electrode 370 may be formed in the third trench 380a of the fifth insulation layer 380 in the shape of a comb and the sixth electrode 375 may be formed in the fourth trench 380b of the fifth insulation layer 380 in the shape of a comb. In a similar process as described with reference to FIGS. 3D to 3E, each of the fifth and sixth electrodes 370 and 375 may be formed into a common wiring extending in the first direction and a number of branch wirings making contact with the common wiring and extending in the second direction. The common wiring may correspond to a body of the comb and the branch wiring may correspond to the teeth of the comb. In the present example embodiment, the fifth and sixth comb-shaped electrodes 370 and 375 may be formed to face each other in the fifth insulation layer 380 and thus the branch wirings of the fifth and sixth electrodes 370 and 375 may be alternately arranged with each other and may be spaced apart from each other along the first direction. Accordingly, the second modified capacitor structure may be formed on the substrate 30.

For example, the electrodes 310, 315, 340, 350, 370, and 375 and the plugs 330, 335, 360, and 365 may include a metal and a metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The first to fifth insulation layers 320, 325, 345, 355, and 380 may include silicon oxide, silicon nitride or a high-k material. Examples of the high-k material may include tantalum oxide (TaO), hafnium oxide (HfO), and combinations thereof. The composition material of the first to fifth insulation layers 320, 325, 345, 355, and 380 may be different from one another, or the first to fifth insulation layers 320, 325, 345, 355, and 380 may have the same composition material.

In addition, the first and the second electrodes 310 and 315 and the fifth and the sixth electrodes 370 and 375 may include vertically stacked metal wirings and via plugs interconnecting the stacked metal wirings.

Accordingly, the first electrode 310, the first insulation layer 320, and the second electrode 315 may function as the first capacitor and the second electrode 315, the second insulation layer 325 and the third electrode 340 may function as the second capacitor at the upper side portion of the substrate 30. The third electrode 340, the third insulation layer 345, and the fourth electrode 350 may function as the third capacitor. In addition, the sixth electrode 375, the fourth insulation layer 355, and the fourth electrode 350 may function as the fourth capacitor at the lower side portion of the substrate 30. The fifth electrode 370, the fifth insulation layer 380, and the sixth electrode 375 may function as the fifth capacitor.

Accordingly, a number of the capacitors may be arranged in the second modified capacitor structure 300, to thereby increase the capacitance per unit area of the second modified structure.

Embodiment II

Figure 8:
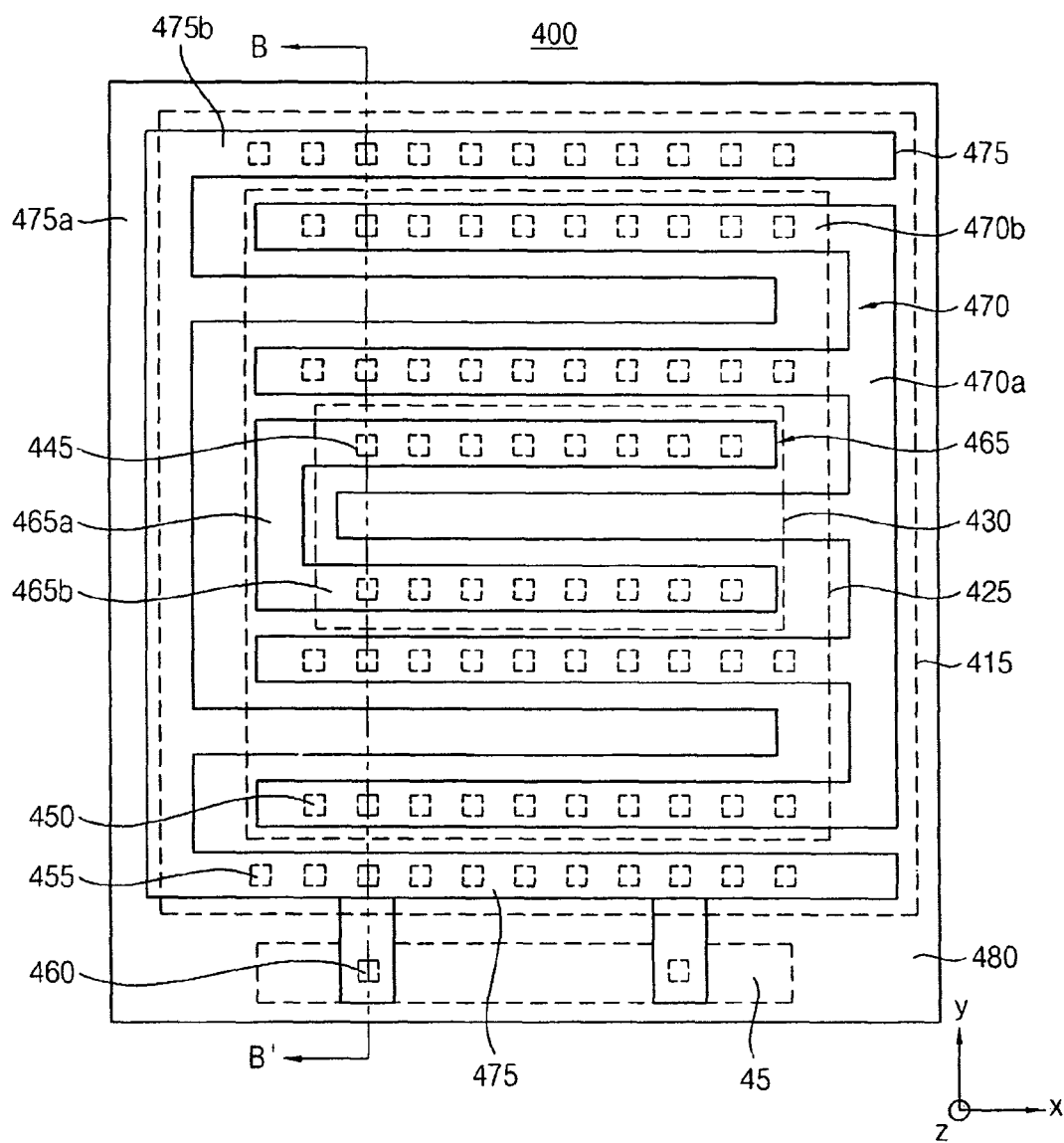
FIG. 8 illustrates a plan view of a capacitor structure in accordance with a second example embodiment of the present inventive concept.
Figure 9:
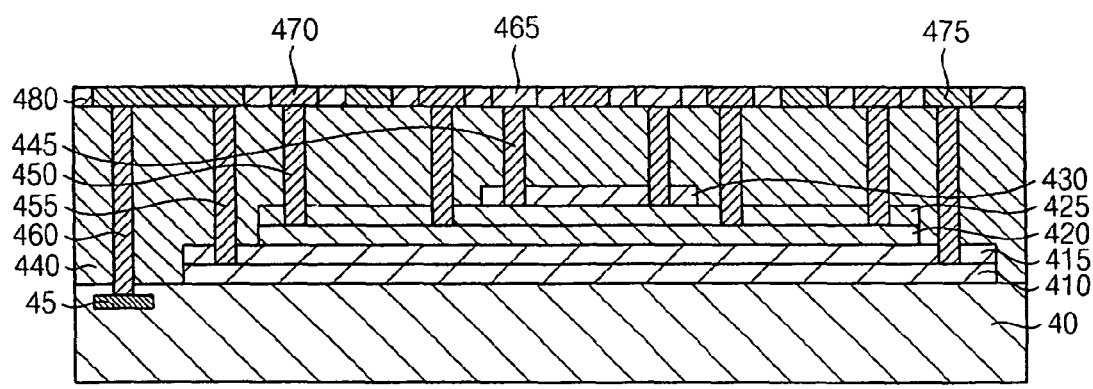
FIG. 9 illustrates a cross-sectional view taken along a line B-B' of FIG. 8.

FIG. 8 illustrates a plan view of a capacitor structure in accordance with a second example embodiment of the present inventive concept. FIG. 9 illustrates a cross-sectional view taken along a line B-B' of FIG. 8. In FIGS. 8 and 9, a direction parallel with the line B-B' is referred to as a first direction and a direction vertical to the line B-B' is referred to as a second direction.

Referring to FIGS. 8 and 9, a capacitor structure 400 in accordance with a second example embodiment of the inventive concept (hereinafter, referred to as second capacitor structure) may include a first electrode 410, a first insulation layer 415, a second electrode 420, a second insulation layer 425, a third electrode 430, a third insulation layer 440, first to fourth plugs 445, 450, 455 and 460, fourth to sixth electrodes 465, 470 and 475, and a fourth insulation layer 480.

In an example embodiment, the second capacitor structure 400 may be formed on a semiconductor substrate 40 having various unit conductive structures of a semiconductor device. For example, the unit conductive structure may include a transistor, a resistor, and a capacitor. In the present example embodiment, the semiconductor substrate 40 may include an active region and a lower insulation layer (not shown) may be formed on the substrate 40. The lower insulation layer may include one of silicon oxide, silicon nitride, and combinations thereof. The lower insulation layer may include a multilayer in which a number of unit layers may be sequentially stacked on the substrate 40. An additional layer may be interposed between the substrate 40 and the lower insulation layer, as would be known to one of the ordinary skill in the art. A plug (not shown) may penetrate through the lower insulation layer to make contact with a portion of the substrate 40. An inner metal wiring 45 may be prepared in the substrate 40.

The first electrode 410 may be positioned on the substrate 40 and be shaped into a plate on the substrate 40. The first insulation layer 415 may be positioned on the first electrode 410.

The second electrode 420 may be positioned on the second insulation layer 415 and may be shaped into a plate. In the present example embodiment, the second electrode 420 may partially overlap the first electrode 410 in such a configuration that the second electrode 420 may not be positioned over a side portion of the first electrode 410, and thus the first electrode 410 may be connected to the third plug 455 through the first insulation layer 415 at the side portion thereof. The surface area of the second electrode 420 may be equal to or smaller than that of the first electrode 410.

The second insulation layer 425 may be positioned on the second electrode 420 and the third electrode 430 may be positioned on the second insulation layer 425 as a plate shape.

In the present example embodiment, the third electrode 430 may partially overlap the second electrode 420 in such a configuration that the third electrode 430 may not be positioned over a side portion of the second electrode 420. Thus, the second electrode 420 may be connected to the second plug 450 through the second insulation layer 425 at the side portion thereof. The surface area of the third electrode 430 may be equal to or smaller than that of the second electrode 420.

The first electrode 410, the first insulation layer 415, and the second electrode 420 may function as a first capacitor. The second electrode 420, the second insulation layer 425, and the third electrode 430 may function as a second capacitor in the second capacitor structure 400.

The third insulation layer 440 may be arranged on the substrate 40 in such a configuration that the first to the third electrodes 410, 420, and 430, and the first and the second insulation layers 415 and 425 may be covered with the third insulation layer 430.

The fourth electrode 465, the fifth electrode 470, and the sixth electrode 475 may be formed in the third insulation layer 440 as a comb shape, respectively. Thus, the fourth to sixth electrodes 465, 470, and 475 may be electrically insulated from each other by the third insulation layer 440. For example, the fourth comb-shaped electrode 465 may include a first common wiring 465a extending in the first direction and a number of first branch wirings 465b making contact with the first common wiring 465a and extending in the second direction. The fifth comb-shaped electrode 470 may include a second common wiring 470a extending in the first direction and a number of second branch wirings 470b making contact with the second common wiring 470a and extending in the second direction. The sixth comb-shaped electrode 475 may include a third common wiring 475a extending in the first direction and a number of third branch wirings 475b making contact with the third common wiring 475a and extending in the second direction. The common wiring may correspond to a body of the comb and the branch wiring may correspond to the teeth of the comb.

In the present example embodiment, the first comb-shaped electrode 465 may be positioned at a central portion of the substrate 40 and may face the fifth electrode 470. Thus, the first and second branch wirings 465b and 470b may be alternately arranged with each other at the central portion of the substrate 40 and may be spaced apart by a same distance. In contrast, the sixth electrode 475 may be positioned on a portion of the substrate 40 except the central portion and may face the fifth electrode 470. Thus, the second and third branch wirings 470b and 475b may be alternately arranged with each other at the upper and lower portion, i.e., peripheral portions of the substrate 40 and may be spaced apart by a same distance. The respective spacings between interleaving branch wirings in the central portion and in the peripheral portions may be the same. Accordingly, both of the fourth and sixth electrodes 465 and 475 may face the fifth electrode 470 and the sixth comb-shaped electrode 475 may include the fourth comb-shaped electrode 465 at a central teeth portion thereof, so that the teeth of the fifth and the sixth comb-shaped electrodes 470 and 475 may be alternately arranged in the first direction at the upper and lower peripheral portions of the substrate 40 and the teeth of the fourth and the fifth comb-shaped electrodes 465 and 470 may be alternately arranged in the first direction at the central portion of the substrate 40.

For example, the fourth electrode 465 may be arranged in the third insulation layer 440 in such a configuration that the fourth electrode 465 may be positioned over the third electrode 430 and may be extended over the second electrode 420 which does not overlap the third electrode 430. In a similar way, the fifth electrode 470 may be arranged in the third insulation layer 440 in such a configuration that the fifth electrode 470 may be positioned over the second and the third electrode 420 and 430 and may extend over the first electrode 410 that does not overlap the second electrode 420. The sixth electrode 475 may be arranged in the third insulation layer 440 in such a configuration that the sixth electrode 475 may be positioned over the second and the third electrode 420 and 430.

The fourth, fifth and sixth electrodes 465, 470, and 475 may have substantially the same structure as the first and second electrodes 170 and 180 as described with reference to FIGS. 1 and 2. Thus, any detailed descriptions on the fourth, fifth and sixth electrodes 465, 470, and 475 will be omitted.

The third and the fourth electrodes 430 and 465 may be electrically connected to each other by the first plugs 445 penetrating through the third insulation layer 440. The second and the fifth electrodes 420 and 470 may be electrically connected to each other by the second plugs penetrating through the third and second insulation layers 440 and 425. The first and the sixth electrodes 410 and 465 may be electrically connected to each other by the third plugs 455 penetrating through the third and the first insulation layers 440 and 415. The sixth electrode 475 and the inner metal wirings 45 may be electrically connected to each other by the fourth plugs penetrating through the third insulation layer 440.

The fourth insulation layer 480 may be arranged on the third insulation layer 440. The fourth, the fifth, and the sixth electrodes may be positioned in the fourth insulation layer 480.

For example, the electrodes 410, 420, 430, 465, 470, and 475 and the plugs 445, 450, 455 and 460 may include a metal and a metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The first to fourth insulation layers 415, 425, 440, and 480 may include silicon oxide, silicon nitride or a high-k material of which the electrical resistance is higher than that of silicon nitride. Examples of the high-k material may include tantalum oxide (TaO), hafnium oxide (HfO) and combinations thereof. The composition material of the first to fourth insulation layers 410, 425, 440, and 480 may be different from one another or may be the same.

Accordingly, the fourth electrode 465, the fourth insulation layer 480, and the fifth electrode 470 may function as a third capacitor, and the fifth electrode 470, the fourth insulation layer 480, and the sixth electrode 475 may function as a fourth capacitor in the second capacitor structure 400, both of which may be, i.e., a capacitor relying on overlap in the x-y plane rather than vertically. In addition, when the fifth electrode 470 is positioned over the third electrode, the third electrode 430, the third insulation layer 440, and the fifth electrode 470 may function as a fifth capacitor in the second capacitor structure 400. In the same way, when the sixth electrode 475 is positioned over the second electrode 420, the second electrode 420, the third insulation layer 440, and the sixth electrode 475 may function as a sixth capacitor in the second capacitor structure 400.

Further, when the fourth electrode 465 is positioned over the second electrode 420 that does not overlap the third electrode 430 in the third insulation layer 440, the fourth electrode 465, the third insulation layer 440, and the second electrode 420 may function as a seventh capacitor in the second capacitor structure 400. Still further, when the fifth electrode 470 is positioned over the first electrode 410 that does not overlap the second electrode 420 in the third insulation layer 440, the fifth electrode 470, the third insulation layer 440, and the first electrode 410 may function as an eighth capacitor in the second capacitor structure 400.

Accordingly, a number of the capacitors may be arranged in the second capacitor structure 400, to thereby increase the capacitance per unit area of the second capacitor structure 400. Again, FIGS. 10A to 10E illustrate cross-sectional views of stages in a method of forming the second capacitor structure shown in FIGS. 8 and 9.

Figure 10A:
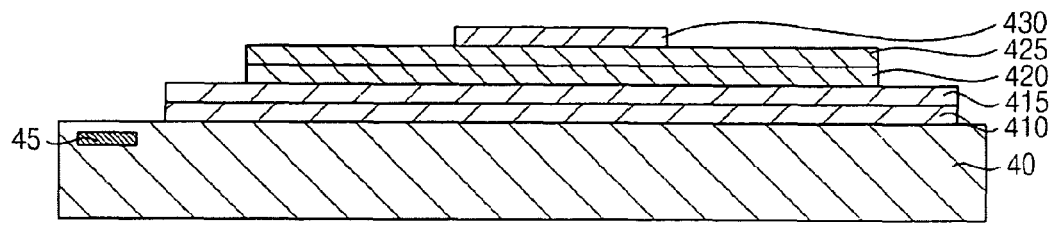
FIGS. 10A to 10E illustrate cross-sectional views of stages in a method of forming the second capacitor structure shown in FIGS. 9 and 10.

Referring to FIG. 10A, the first electrode 410, the first insulation layer 415, the second electrode 420, the second insulation layer 425, and the third electrode 430 may be sequentially formed on the substrate 40 on which various inner metal wirings 45 may be arranged. For example, a deposition process may be used for the formation of the first electrode 410, the first insulation layer 415, the second electrode 420, the second insulation layer 425, and the third electrode 430. In the present example embodiment, the first, the second and third electrodes 410, 420, and 430 may be formed into a plate shape.

The second electrode 420 may partially overlap the first electrode 410. Thus, the third plugs 455 may be connected to the first electrode 410 through the first insulation layer 415. In the present example embodiment, the second electrode 420 may not overlap the upper and lower side portions of the first electrode 410. Thus, the third plugs 455 may be connected to the upper and side portions of the first electrode 410 without any interruption of the second electrode 420. Therefore, the surface area of the second electrode 420 may be smaller than or equal to that of the first electrode 410.

Further, the third electrode 430 may partially overlap the second electrode 420. Thus, the second plugs 450 may be connected to the second electrode 420 through the second insulation layer 425. In the present example embodiment, the third electrode 430 may not overlap the upper and lower side portions of the second electrode 420. Thus, the second plugs 450 may be connected to the upper and side portions of the second electrode 420 without any interruption of the third electrode 430. Therefore, the surface area of the third electrode 430 may be smaller than or equal to that of the second electrode 420.

Figure 10B:
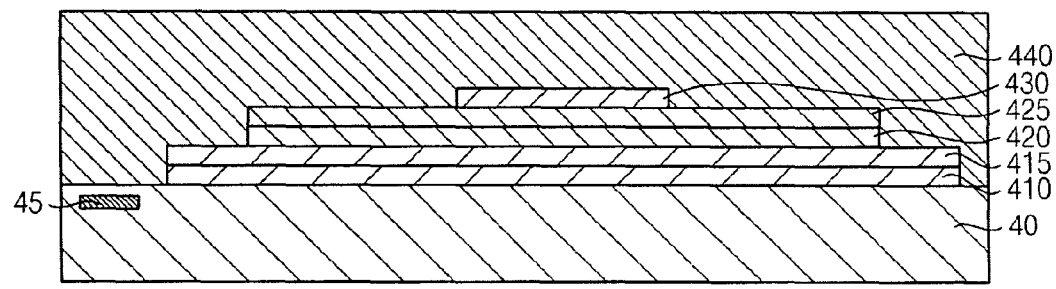

Referring to FIG. 10B, the third insulation layer 440 may be formed on the substrate 40 and thus the first electrode, the first insulation layer 415, the second electrode 420, the second insulation layer 425, and the third electrode 430 may be covered with the third insulation layer 440.

Figure 10C:
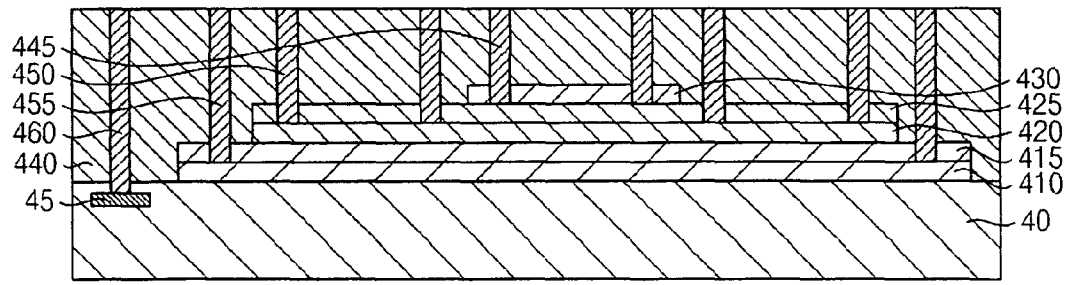

Referring to FIG. 10C, the third insulation layer 440, the second insulation layer 425, the first insulation layer 415, and the substrate 40 may be partially etched off to thereby form a plurality of openings (not shown) through which the third electrode 430, the second electrode 420, the first electrode 410, and the substrate 40 may be exposed, respectively. The openings may be formed simultaneously in a single process or individually in respective processes.

A conductive layer (not shown) may be formed on the third insulation layer 440 to a sufficient thickness to fill up the openings by a deposition process. Then, the conductive layer may be planarized by a planarization process until an upper surface of the third insulation layer 440 is exposed. Therefore, the conductive layer may remain only in the openings, to thereby form the first, second, third, and fourth plugs 445, 450, 455, and 460 in the openings, respectively. The planarization process may include a CMP process, an etch-back process and a grinding process.

The first plugs 445 may penetrate through the third insulation layer 440 and may make contact with the third electrode 430. The second plugs 450 may penetrate through both of the third and the second insulation layers 440 and 425, and may make contact with the second electrode 420. The third plugs 455 may penetrate through both of the third and the first insulation layers 440 and 415, and may make contact with the first electrode 410. The fourth plugs 460 may penetrate through both of the third insulation layer 440 and the substrate 40, and may make contact with the inner metal wirings 45.

Figure 10D:
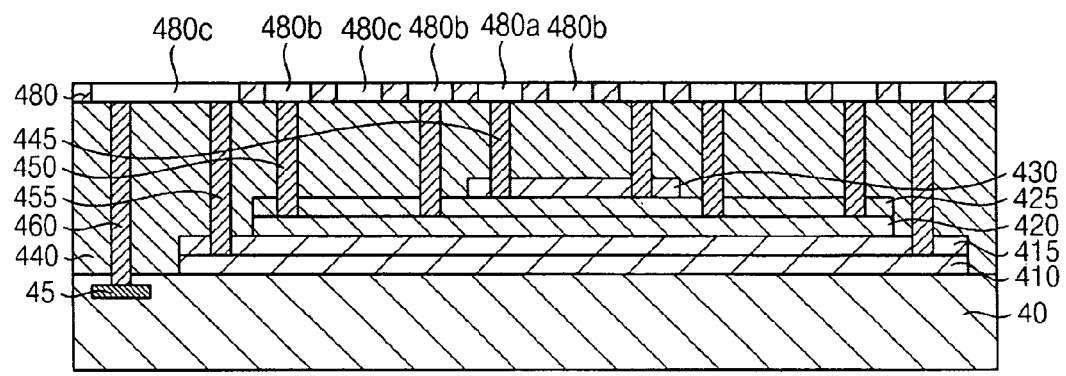

Referring to FIG. 10D, the fourth insulation layer 480 may be formed on the third insulation layer 430. For example, a chemical vapor deposition (CVD) process may be used for the formation of the fourth insulation layer 480.

Then, the fourth insulation layer 480 may be partially etched off from the third insulation layer 430, to thereby form a first trench 480a through which the first plugs 445 is exposed, a second trench 480b through which the second plug 450 is exposed, and a third trench 480c through which the third and the fourth plugs 455 and 460 are exposed.

The first trench 480a may be formed into a comb at the central portion of the fourth insulation layer 480 and the second trench 482b may also be formed into a comb facing the first comb-shaped trench 480a on the whole fourth insulation layer 480. Thus, the teeth of the first comb-shaped trench 480a and the second comb-shaped trench 480b may be formed alternately with each other at the central portion of the fourth insulation layer 480. The third trench 480c may also be formed into a comb facing the second trench 480b on the whole fourth insulation layer 480. Therefore, the teeth of the second comb-shaped trench 480b and the third comb-shaped trench 480c may be formed alternately with each other at a portion of the fourth insulation layer 480 except the central portion thereof. Therefore, the teeth of the first and second comb-shaped trenches 480a and 480b may be alternate and parallel with each other at the central portion of the fourth insulation layer 480, and the teeth of the second and third comb-shaped trenches 480b and 480c may be alternate and parallel with each other at the portion of the fourth insulation layer 480 except the central portion.

Figure 10E:
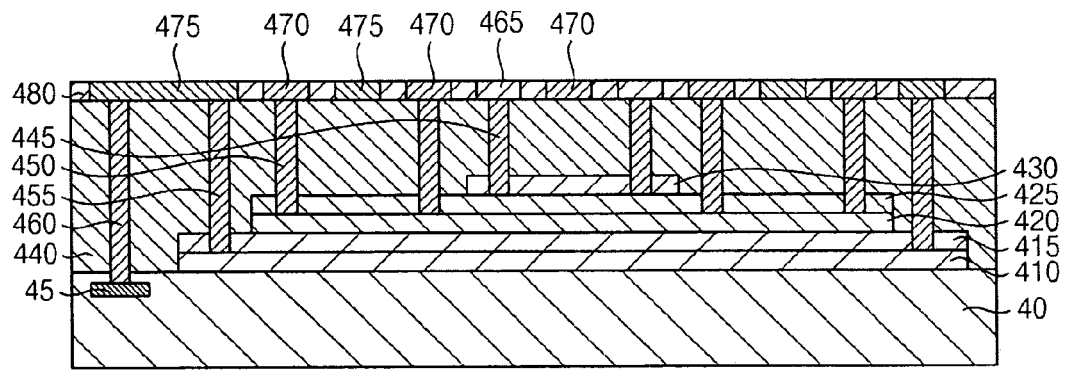

Referring to FIG. 10E, another conductive layer, e.g., including a metal or a metal nitride, may be formed on the fourth insulation layer 480 to a sufficient thickness to fill the comb-shaped first to third trenches 480a, 480b and 480c. The another conductive layer may then be planarized by a planarization process until an upper surface of the fourth insulation layer 480 is exposed. Therefore, the fourth electrode 465, the fifth electrode 470, and the sixth electrode 475 may be formed in the first, second, and third trenches 480a, 480b, and 480c of the fourth insulation layer 480, respectively.

That is, the fourth electrode 465 may be formed in the first trench 480a of the fourth insulation layer 480 as a shape of the comb and the fifth electrode 470 may be formed in the second trench 480b of the fourth insulation layer 480 as a shape of the comb. Further, the sixth electrode 475 may be formed in the third trench 480c of the fourth insulation layer 480 as a shape of the comb.

In a similar process as described with reference to FIGS. 3D to 3E, the fourth, fifth, and sixth electrodes 465, 470 and 475 may be formed into a common wiring extending in the first direction and a number of branch wirings making contact with the common wiring and extending in the second direction. As described above, the common wiring may correspond to a body of the comb and the branch wiring may correspond to the teeth of the comb. In the present example embodiment, the first comb-shaped electrode 465 may be positioned at the central portion of the fourth insulation layer 480 and may face the fifth electrode 470. Thus, the first and second branch wirings 465b and 470b may be alternately arranged with each other at the central portion of the fourth insulation layer 480. In contrast, the sixth electrode 475 may be positioned on a portion of the fourth insulation layer 480 except the central portion and may face the fifth electrode 470. Thus, the second and third branch wirings 470b and 475b may be alternately arranged with each other at the upper and lower portion of the fourth insulation layer 480. Accordingly, both of the fourth and sixth electrodes 465 and 475 may face the fifth electrode 470 and the sixth comb-shaped electrode 475 may include the fourth comb-shaped electrode 465 at a central teeth portion thereof, so that the teeth of the fifth and the sixth comb-shaped electrodes 470 and 475 may be alternately arranged in the first direction at the upper and lower side portions of the fourth insulation layer 480, and the teeth of the fourth and the fifth comb-shaped electrodes 465 and 470 may be alternately arranged in the first direction at the central portion of the fourth insulation layer 480.

For example, the electrodes 410, 420, 430, 465, 470, and 475 and the plugs 445, 450, 455, and 460 may include a metal and a metal nitride. Examples of the metal may include copper (Cu), tungsten (W), aluminum (Al), ruthenium (Ru), platinum (pt), titanium (Ti), tantalum (Ta), etc. These may be used alone or in combinations thereof. Examples of the metal nitride may include tungsten nitride (WN), tantalum nitride (TaN), titanium nitride (TiN), and combinations thereof.

The first to fourth insulation layers 415, 425, 440, and 480 may include silicon oxide, silicon nitride, or a high-k material. Examples of the high-k material may include tantalum oxide (TaO), hafnium oxide (HfO), and combinations thereof. The composition material of the first to fourth insulation layers 410, 425, 440, and 480 may be different from one another, or the first to fourth insulation layers 410, 425, 440 and 480 may have the same composition material.

According to an example embodiment of the second capacitor structure 400, the first electrode 410, the first insulation layer 415, and the second electrode 420 may function as a first capacitor, and the second electrode 420, the second insulation layer 425, and the third electrode 430 may function as a second capacitor in the second capacitor structure 400. In addition, the fourth electrode 465, the fourth insulation layer 480, and the fifth electrode 470 may function as a third capacitor, and the fifth electrode 470, the fourth insulation layer 480, and the sixth electrode 475 may function as a fourth capacitor in the second capacitor structure 400. In addition, when the fifth electrode 470 is positioned over the third electrode, then the third electrode 430, the third insulation layer 440, and the fifth electrode 470 may function as a fifth capacitor in the second capacitor structure 400. In the same way, when the sixth electrode 475 is positioned over the second electrode 420, the second electrode 420, the third insulation layer 440 and the sixth electrode 475 may function as a sixth capacitor in the second capacitor structure 400. Further, when the fourth electrode 465 is positioned over the second electrode 420 that does not overlap the third electrode 430 in the third insulation layer 440, then the fourth electrode 465, the third insulation layer 440, and the second electrode 420 may function as a seventh capacitor in the second capacitor structure 400. Still further, when the fifth electrode 470 is positioned over the first electrode 410 that does not overlap the second electrode 420 in the third insulation layer 440, the fifth electrode 470, the third insulation layer 440, and the first electrode 410 may function as an eighth capacitor in the second capacitor structure 400.

Accordingly, a number of the capacitors may be arranged in the second capacitor structure 400, to thereby increase the capacitance per unit area of the second capacitor structure 400.

According to the example embodiments of the present inventive concept, a plurality of the capacitors may be formed along vertical and horizontal directions in the capacitor structure, to thereby improve an overall capacitance per unit area of the capacitor structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A capacitor structure, comprising:
    a pair of first and second plate electrodes stacked along a first direction on a substrate in which at least an inner wiring is arranged;
    a first insulation layer at least partially interposed between the first and the second electrodes along the first direction, so that the first and the second plate electrodes are electrically insulated from each other;
    a second insulation layer on the substrate such that the first electrode, the first insulation layer, and the second electrode are covered with the second insulation layer;
    a first plug extending through the second insulation layer along the first direction, the first plug making electrical contact with the second electrode;
    a second plug extending through the first and the second insulation layers along the first direction, the second plug making electrical contact with the first electrode;
    a third insulation layer on the second insulation layer;
    a comb-shaped third electrode making contact with the first plug in the third insulation layer, the third electrode having a first common wiring extending in a second direction and a plurality of first branch wirings extending in a third direction, the first, second, and third directions all being orthogonal to one another, the plurality of first branch wirings being commonly connected to the first common wiring; and
    a comb-shaped fourth electrode making contact with the second plug in the third insulation layer and facing the third comb-shaped electrode, the fourth electrode having a second common wiring extending in the second direction and a plurality of second branch wirings extending in the third direction, the plurality of second branch wirings being commonly connected to the second common wiring, the first and the second branch wirings being alternately arranged and spaced apart in the third direction.

2. The capacitor structure as claimed in claim 1, wherein the second electrode overlaps the first electrode but is not positioned on a side portion of the first electrode, so that the fourth electrode is positioned over the side portion of the first electrode along the first direction with the first and the second insulation layers in between.

3. The capacitor structure as claimed in claim 1, wherein the third and the fourth electrodes include a multi-layered structure having a plurality of metal wirings stacked along the first direction and a plurality of via plugs for electrically connecting the metal wirings.

4. The capacitor structure as claimed in claim 1, further comprising:
    a fourth insulation layer below the first electrode on the substrate along the first direction;
    a comb-shaped fifth electrode arranged in the fourth insulation layer, the fifth electrode having a third common wiring extending in the second direction and a plurality of third branch wirings extending in the third direction, the plurality of third branch wirings being commonly connected to the third common wiring;
    a comb-shaped sixth electrode arranged in the fourth insulation layer and facing the fifth comb-shaped electrode, the sixth electrode having a fourth common wiring extending in the second direction and a plurality of fourth branch wirings extending in the third direction, the plurality of fourth branch wirings being commonly connected to the fourth common wiring such that the third and the fourth branch wirings are alternately arranged and are spaced apart in the third direction;
    a fifth insulation layer between the fourth insulation layer and the first electrode along the first direction such that the first and second electrodes are electrically insulated from the fifth and the sixth comb-shaped electrodes;
    a third plug extending through the fifth insulation layer, the third plug making electrical contact with the first and the fifth electrodes; and
    a fourth plug extending through the second insulation layer, the fourth plug making contact with the second electrode.

5. The capacitor structure as claimed in claim 4, wherein the first and the second electrodes partially overlap in the third direction, so that the fourth electrode is positioned over a side portion of the first electrode through the first and the second insulation layers and the sixth electrode is positioned below a side portion of the second electrode along the first direction with the first and the fifth insulation layers in between.

6. The capacitor structure as claimed in claim 4, wherein the third and the fourth branch wirings are spaced apart by a same distance in the third direction.

7. The capacitor structure as claimed in claim 1, further comprising:
    a fifth plate electrode below the first electrode along the first direction and on the substrate;
    a fourth insulation layer interposed between the first electrode and the fifth electrode, the fourth insulation layer electrically insulating the first and fifth electrodes;
    a comb-shaped sixth electrode arranged in the second insulation layer and facing the fourth comb-shaped electrode, the sixth electrode having a third common wiring extending in the second direction and a plurality of third branch wirings extending in the third direction, the plurality of third branch wirings commonly connected to the third common wiring, such that the second and the third branch wirings are alternately arranged and are spaced apart in the third direction at a central portion of the second insulation layer and the first and the third branch wirings are alternately arranged and are spaced apart in the third direction at a peripheral portion of the second insulation layer; and a third plug extending through the second and the fourth insulation layers, the third plug making electrical contact with the fifth and the sixth electrodes.

8. The capacitor structure as claimed in claim 7, wherein the first electrode overlaps the fifth electrode and is not positioned on a side portion of the fifth electrode along the first direction, and the second electrode overlaps the first electrode and is not positioned on a side portion of the first electrode along the first direction, so that the sixth electrode is positioned over the fifth electrode along the first direction with the fourth and the second insulation layers in between.

9. The capacitor structure as claimed in claim 7, further comprising a fourth plug extending through the second insulation layer, the fourth plug making contact with the sixth electrode and the inner wiring in the substrate.

10. The capacitor structure as claimed in claim 7, wherein the second and the third branch wirings are spaced apart by a same distance in the third direction in the central portion of the second insulation layer.

11. The capacitor structure as claimed in claim 10, wherein the first and the third branch wirings are spaced apart by the same distance in the third direction in the peripheral portion of the second insulation layer.

12. The capacitor structure as claimed in claim 7, wherein the first and the third branch wirings are spaced apart by a same distance in the third direction in the peripheral portion of the second insulation layer.

* * * * *